United States Patent
Takeda

(10) Patent No.: US 8,796,763 B2
(45) Date of Patent: Aug. 5, 2014

(54) SEMICONDUCTOR DEVICE AND METHOD OF MANUFACTURING SEMICONDUCTOR DEVICE

(71) Applicant: Renesas Electronics Corporation, Kanagawa (JP)

(72) Inventor: Hiroshi Takeda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/766,202

(22) Filed: Feb. 13, 2013

(65) Prior Publication Data

US 2013/0214348 A1 Aug. 22, 2013

(30) Foreign Application Priority Data

Feb. 20, 2012 (JP) ................. 2012-034120

(51) Int. Cl.
*H01L 29/78* (2006.01)
(52) U.S. Cl.
USPC ............ 257/330; 257/288; 257/300; 257/370
(58) Field of Classification Search
USPC ......................................... 257/280–350, 370
See application file for complete search history.

(56) References Cited

U.S. PATENT DOCUMENTS

| 7,816,741 B2 | 10/2010 | Noda et al. |
| 2006/0027861 A1* | 2/2006 | Takaishi .................... 257/330 |
| 2009/0311839 A1 | 12/2009 | Miyahara et al. |

FOREIGN PATENT DOCUMENTS

| JP | 2008-277352 A | 11/2008 |
| JP | 2009-302436 A | 12/2009 |

* cited by examiner

*Primary Examiner* — Mamadou Diallo
(74) *Attorney, Agent, or Firm* — Mattingly & Malur, PC

(57) ABSTRACT

In a vertical transistor, to raise a drain withstand voltage while lowering an on-resistance. A drift layer 120 is formed above a drain layer 110, and has a first conductivity type. A gate insulating film 170 is formed on a side wall of a concave portion 142. A bottom surface insulating film 172 is formed on a bottom surface of the concave portion 142. A gate electrode 180 is buried in the concave portion 142. A source layer 150 is formed in a channel layer 140. A first conductivity type layer 130 is located between the channel layer 140 and the drift layer 120. An impurity concentration of the first conductivity type layer 130 is higher than an impurity concentration of the drift layer 120.

14 Claims, 36 Drawing Sheets

SEMICONDUCTOR DEVICE AND METHOD OF MANUFACTURING SEMICONDUCTOR DEVICE

CROSS-REFERENCE TO RELATED APPLICATION

The disclosure of Japanese Patent Application No. 2012-034120 filed on Feb. 20, 2012 including the specification, drawings and abstract is incorporated herein by reference in its entirety.

BACKGROUND

The present invention relates to a semiconductor device and a method of manufacturing the semiconductor device, and in particular, to a semiconductor device having a vertical transistor and a method of manufacturing the semiconductor device.

One of semiconductor devices includes a semiconductor device having a vertical transistor. The vertical transistor is, for example, used for an element that controls a high current. Some vertical transistors have a trench gate structure. A transistor with the trench gate structure has the following structure. First, a concave portion is formed in a substrate. A gate insulating film is formed on a side surface of the concave portion. Additionally, a gate electrode is buried in the concave portion.

One of the characteristics required for the transistor with the trench gate structure includes lowering an on-resistance and raising a drain withstand voltage. The on-resistance and the drain withstand voltage are generally conflicting characteristics. In contrast to this, a transistor described in FIGS. 11 and 12 in Patent Document 1 (Japanese Patent Laid-Open No. 2009-302436) has an n-type current dispersion layer between an n-type drift layer and a p-type channel layer (base layer) in order to lower an on-resistance while raising a drain withstand voltage. In this technology, the current dispersion layer is located above an insulating film of a bottom of a concave portion.

In addition, Patent Document 2 (Japanese Patent Laid-Open No. 2008-277352) describes that an n-type well layer is formed between a p-type body layer (corresponding to a channel layer) and an N-layer (corresponding to a drift layer). When viewed in a thickness direction of a substrate, an upper end of the well layer is located above an insulating film of a bottom of a concave portion, and a lower end of the well layer is located below the insulating film of the bottom of the concave portion.

SUMMARY

The present inventor has considered that there is room for further improvement in a drain withstand voltage in the case of providing an impurity layer functioning as a current dispersion layer. The other problems and the new feature will become clear from the description of the present specification and the accompanying drawings.

According to an embodiment, a first conductivity type layer is provided in a transistor with a trench gate structure. The first conductivity type layer is located between a drift layer and a channel layer, and an impurity concentration of the first conductivity type layer is higher than that of the drift layer. Additionally, when viewed in a thickness direction of the first conductivity type layer, at least one of an upper end and a lower end of the first conductivity type layer, and a center thereof overlap with a bottom surface insulating film located on a bottom surface of a concave portion.

According to the above-described embodiment, a drain withstand voltage can be raised while lowering an on-resistance in a vertical transistor.

DETAILED DESCRIPTION

Hereinafter, embodiments of the present invention will be explained using drawings. Note that, in all the drawings, a similar symbol is attached to a similar component, and that explanation thereof is appropriately omitted. It should be noted that in the following embodiments, a first conductivity type is, for example, an n type, and a second conductivity type is a p type. However, the first conductivity type may be the p type and the second conductivity type may be the n type.

First Embodiment

Figure 1:
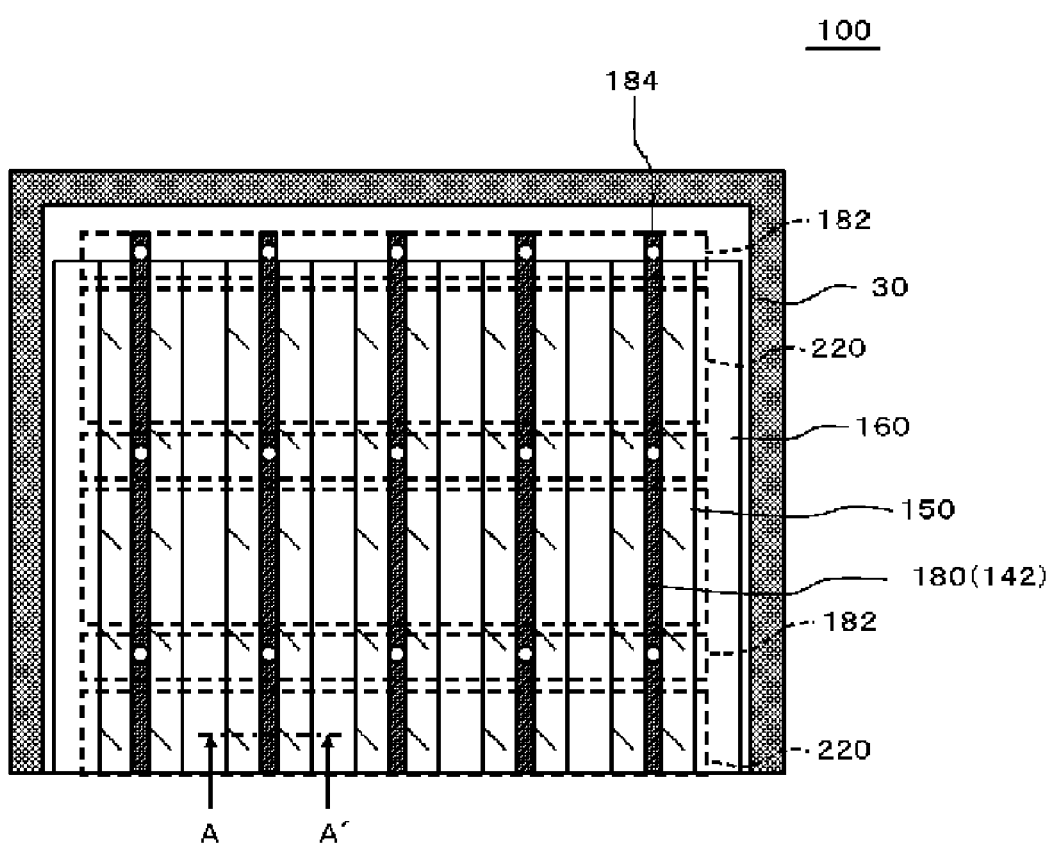
FIG. 1 is a plan view showing a configuration of a semiconductor device according to a first embodiment.
Figure 2:
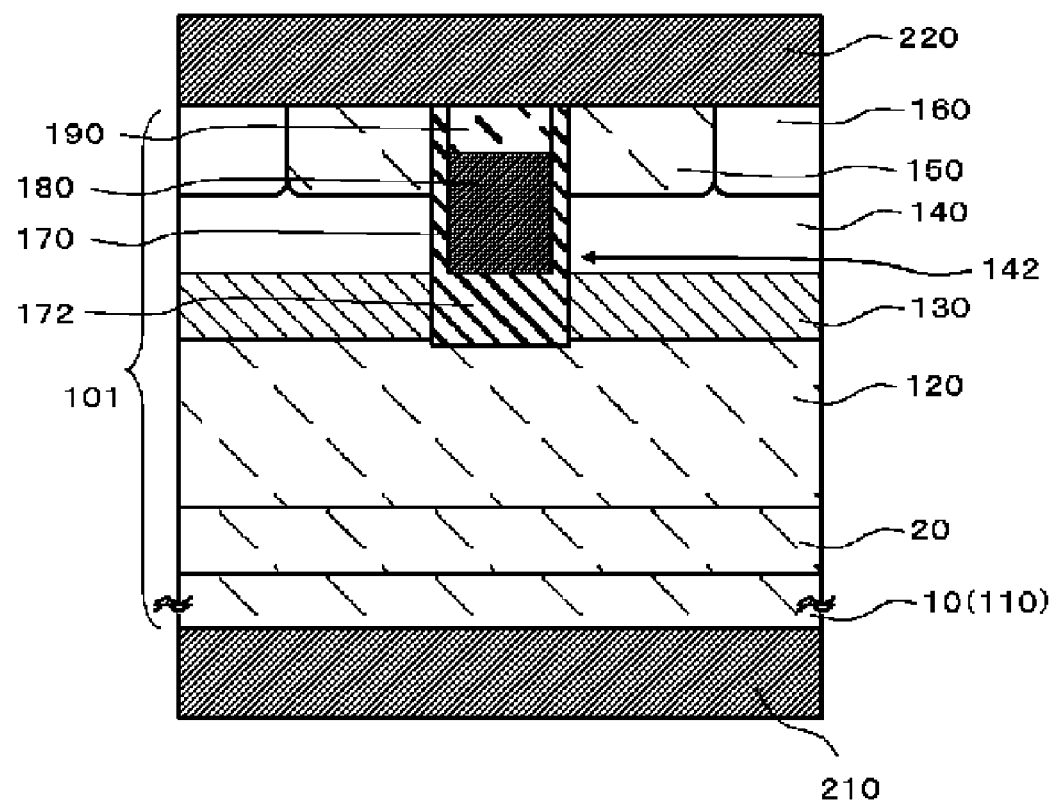
FIG. 2 is a cross-sectional view of the semiconductor device taken along a line A-A' of FIG. 1.

FIG. 1 is a plan view showing a configuration of a semiconductor device 100 according to a first embodiment. FIG. 2 is a cross-sectional view of the semiconductor device 100 taken along a line A-A' of FIG. 1. The semiconductor device 100 has a vertical transistor. This vertical transistor is, for example, used as a power control element. The semiconductor device 100 includes: a drain layer 110; a drift layer 120; a concave portion 142; a gate insulating film 170; a bottom surface insulating film 172; a gate electrode 180; a source layer 150; and a first conductivity type layer 130. The drain layer 110 is formed in a semiconductor substrate 101 via a buffer layer 20. The drift layer 120 is formed above the drain layer 110, and has a first conductivity type. An impurity concentration of the drift layer 120 is lower than an impurity concentration of the drain layer 110. A channel layer 140 is located above the drain layer 110, and has a second conductivity type. The concave portion 142 is formed in the channel layer 140, and a lower end thereof is located below the channel layer 140. That is, the concave portion 142 penetrates the channel layer 140. The gate insulating film 170 is formed on a side wall of the concave portion 142. The bottom surface insulating film 172 is formed on a bottom surface of the concave portion 142. The gate electrode 180 is buried in the concave portion 142. The source layer 150 is formed in the channel layer 140. The source layer 150 has the first conductivity type. The source layer 150 is formed so as to be shallower than the channel layer 140, and is located next to the concave portion 142 when viewed from a plane. The first conductivity type layer 130 is located between the channel layer 140 and the drift layer 120. An impurity concentration of the first conductivity type layer 130 is higher than the impurity concentration of the drift layer 120. Although the impurity concentration of the first conductivity type layer 130 is, for example, ten times or more of the impurity concentration of the drift layer 120, it is preferably not more than one thousand times thereof.

A current that has flowed through the drift layer 120 (or the channel layer 140) is promptly diffused in a plane direction (horizontal direction in FIG. 2) of the first conductivity type layer 130, when flowing through the first conductivity type layer 130. This is because the impurity concentration of the first conductivity type layer 130 is high and the first conductivity type layer 130 has a low resistance, and an on-resistance of the vertical transistor becomes low due to diffusion in the plane direction. Additionally, when viewed in a thickness direction, at least one of an upper end and a lower end of the first conductivity type layer 130, and a center thereof overlap with the bottom surface insulating film 172. With this configuration, a drain withstand voltage of the vertical transistor becomes high. This reason will be mentioned later. It should be noted that the upper end and the lower end of the first conductivity type layer 130 is defined, for example, as a portion in which an impurity concentration thereof is higher than that of the drift layer 120 by approximately a thousandth of a difference between a peak concentration of the first conductivity type layer 130 and a peak concentration of the impurity concentration of the drift layer 120. Hereinafter, the present embodiment will be explained in detail.

First, a planar layout of the semiconductor device 100 will be explained using FIG. 1. In a planar view, a transistor formation region where the vertical transistor has been formed is isolated from the other regions by an element isolating film 30. The element isolating film 30 is, for example, the insulating film buried in the semiconductor substrate 101, and a lower end thereof is located inside the drift layer 120. That is, a groove in which the element isolating film 30 is buried penetrates the channel layer 140 and the first conductivity type layer 130, and is entrenched to the middle of the drift layer 120. The element isolating film 30 is provided, and thus short-circuiting of a drain electrode 210 (refer to FIG. 2) and a source electrode 220 (refer to FIG. 2) can be suppressed in the semiconductor device 100 being individually divided. It should be noted that the element isolating film 30 may be an intrinsic semiconductor layer.

The channel layer 140 is formed in the transistor formation region located inside the element isolating film 30. A plurality of concave portions 142 is formed in the channel layer 140. Each of the concave portions 142 has a portion parallel to one another. The gate electrode 180 is buried in the concave portion 142 as described above. The gate electrode 180 is coupled to a gate wiring 182 via a contact 184. The gate wiring 182 is formed in the same layer as the source electrode 220, and is isolated from the source electrode 220. In an example shown in this figure, when viewed in a direction where the gate electrode 180 extends, the gate wiring 182 and the source electrode 220 are alternately provided. However, the source electrode 220 is larger than the gate wiring 182. Each of the plurality of gate wirings 182 extends in a direction intersecting with (for example, a direction perpendicular to) the plurality of gate electrodes 180. Additionally, each of the gate wirings 182 is coupled to the gate electrode 180 via the contact 184 on an intersection of each gate electrode 180. Although the gate wiring 182 and the source electrode 220 are, for example, formed of Al, they may be formed of other conductive materials. In addition, a barrier metal film such as Ti may be formed at a boundary of the gate wiring 182 and the source electrode 220, the source layer 150 and a base layer 160.

The source layer 150 is formed in a region of the channel layer 140, located on both sides of the gate electrode 180. Additionally, the base layer 160 of the same conductivity type as the channel layer 140 (i.e., the second conductivity type) is formed on a surface layer of a region located between the source layers 150. An impurity concentration of the base layer 160 is larger than an impurity concentration of the channel layer 140. That is, the base layer 160 functions as a region for transmitting a reference potential to the channel layer 140. This reference potential is transmitted from the source electrode 220.

A plurality of source electrodes 220 extends in the direction intersecting with the gate electrode 180 and is coupled to a plurality of source layers 150. In the example shown in this figure, the respective source electrodes 220 are coupled to all the source layers 150.

Next, a cross-sectional structure of the semiconductor device 100 will be explained using FIG. 2. In the present embodiment, the semiconductor substrate 101 has epitaxial layers except for the drain layer 110. Additionally, the drain layer 110 serves as a substrate 10 for performing the epitaxial growth. Each layer constituting the semiconductor substrate 101 is a compound semiconductor layer, such as a nitride semiconductor layer or SiC, or diamond, except for the drain layer 110. The nitride semiconductor layer is, for example, a GaN layer. The substrate 10 (i.e., the drain layer 110) is a substrate having conductivity, such as a silicon substrate into which an impurity has been introduced. The drain electrode 210 is formed on a back surface of the substrate 10. Although the drain electrode 210 is, for example, formed of Al, it may be formed of other conductive materials. In addition, the barrier metal film, such as Ti, may be formed at a boundary of the drain electrode 210 and the substrate 10.

Over the substrate 10, the drift layer 120, the first conductivity type layer 130, and the channel layer 140 are formed in this order, via the buffer layer 20. For example, when the substrate 10 is the silicon substrate, and the semiconductor substrate 101 is the GaN layer, the buffer layer 20 includes GaN, AlGaN, and AlN, and may have a stacked structure of the each material. In addition, the buffer layer 20 is not indispensable when lattice matching is held between a material constituting the substrate 10 and a material constituting the semiconductor substrate 101. A thickness of the drift layer 120 is, for example, not less than 1 μm and not more than 10 μm. A thickness of the first conductivity type layer 130 is, for example, not less than 0.5 μm and not more than 1 μm. A thickness of the channel layer 140 is, for example, not less than 0.5 μm and not more than 1 μm. It should be noted that these values can be changed depending on characteristics required for the vertical transistor.

The source layer 150 and the base layer 160 are formed by ion-injecting an impurity in a surface layer of the channel layer 140. In this figure, although a depth of the base layer 160 is the same as that of the source layer 150, it may be shallower or deeper than that of the source layer 150. Additionally, the source electrode 220 is formed on a surface of the channel layer 140. That is, the source layer 150 and the base layer 160 are coupled to the source electrode 220. That is, the reference potential is applied to the channel layer 140 via the source electrode 220 and the base layer 160.

It should be noted that an impurity is introduced into the drift layer 120, the first conductivity type layer 130, and the channel layer 140 at the time of epitaxial growth. Therefore, a boundary of each layer is clear.

As described above, the lower end of the concave portion 142 is located inside the drift layer 120. Additionally, the gate insulating film 170 is formed on the side surface of the concave portion 142, and the bottom surface insulating film 172 is formed on the bottom surface of the concave portion 142. Although the gate insulating film 170 and the bottom surface insulating film 172 are, for example, aluminum oxide films, they may be silicon oxide films, silicon oxynitride films, silicon nitride films, or high-permittivity insulating films. The bottom surface insulating film 172 is thicker than the gate insulating film 170. It should be noted that the bottom surface insulating film 172 and the gate insulating film 170 are, for example integrated. Additionally, when viewed in a thickness direction of the semiconductor substrate 101, both the upper end and the lower end of the first conductivity type layer 130 overlap with the bottom surface insulating film 172. That is, the first conductivity type layer 130 is thinner than the bottom surface insulating film 172, and the whole of the first conductivity type layer 130 overlaps with the bottom surface insulating film 172 in the thickness direction of the semiconductor substrate 101.

The gate electrode 180 is buried inside the concave portion 142. Although the gate electrode 180 is, for example, formed of polysilicon, other conductive materials may be used. When viewed in the thickness direction of the semiconductor substrate 101, it is preferable that a lower end of the gate electrode 180 is aligned with the upper end of the first conductivity type layer 130, in the present embodiment. When the lower end of the gate electrode 180 is located below the upper end of the first conductivity type layer 130, there occurs a possibility that electric field concentration is caused in a portion of the gate insulating film 170 facing the lower end of the gate electrode 180. Meanwhile, when the lower end of the gate electrode 180 is separated from the first conductivity type layer 130, there occurs a possibility that a channel is not formed in a portion of the channel layer 140 not facing the gate electrode 180. In this case, the on-resistance of the vertical transistor becomes high.

Although an upper surface of the gate electrode 180 is higher than the lower end of the source layer 150, it is lower than an upper surface of the channel layer 140. Additionally, an interlayer insulating film 190 is buried in a space of the concave portion 142 located over the gate electrode 180. That is, the upper surface of the gate electrode 180 is covered with the interlayer insulating film 190. The interlayer insulating film 190 is, for example, a silicon nitride film.

It should be noted that impurity concentrations of the substrate 10, the source layer 150, and the base layer 160 are, for example, not less than $1 \times 10^{20}$ cm$^{-3}$ and not more than $1 \times 10^{21}$ cm$^{-3}$. The impurity concentration of the channel layer 140 is, for example, not less than $1 \times 10^{17}$ cm$^{-3}$ and not more than $1 \times 10^{18}$ cm$^{-3}$. The impurity concentration of the drift layer 120 is, for example, not less than $1 \times 10^{16}$ cm$^{-3}$ and not more than $1 \times 10^{17}$ cm$^{-3}$. Additionally, the impurity concentration of the first conductivity type layer 130 is, for example, not less than $1 \times 10^{17}$ cm$^{-3}$ and not more than $1 \times 10^{19}$ cm$^{-3}$.

Figure 3:
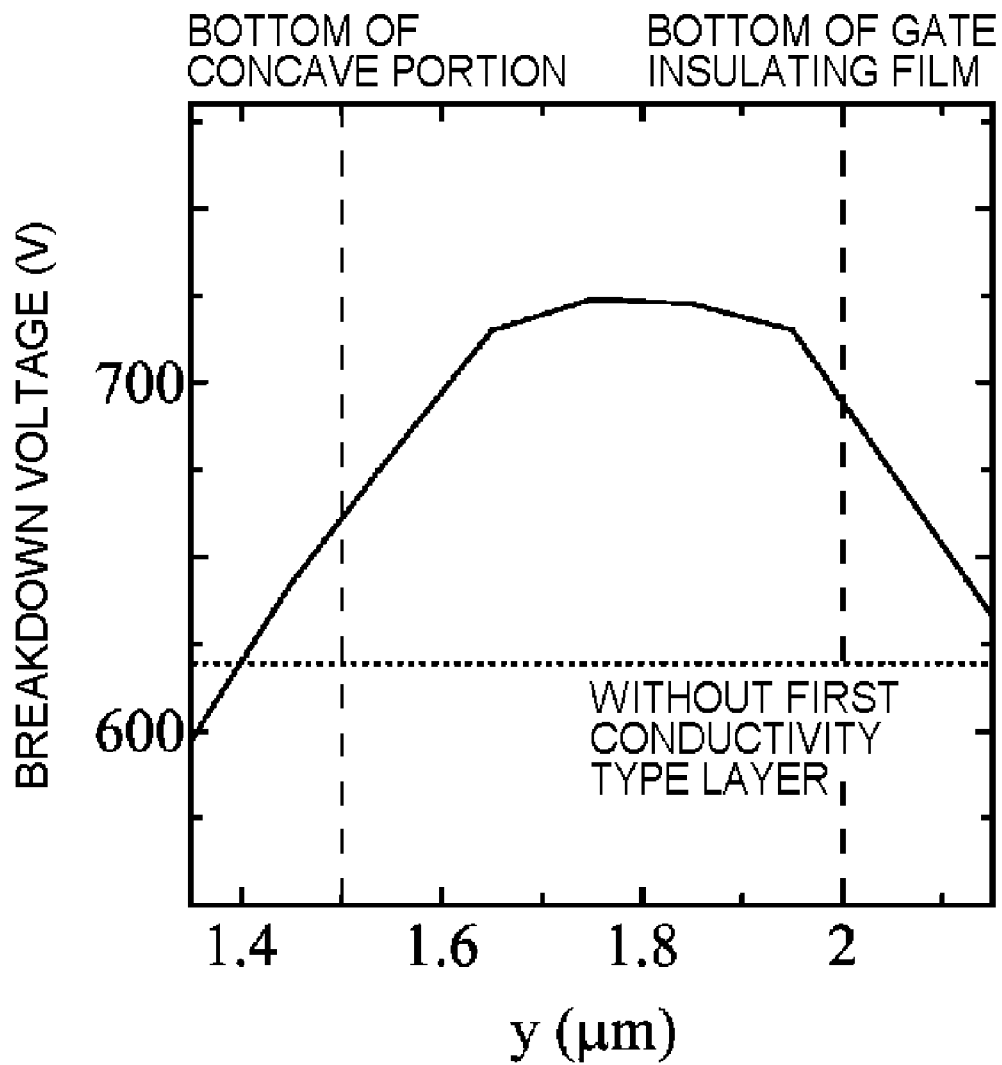
FIG. 3 is a graph showing a relation between a position of a center of a first conductivity type layer when viewed in a thickness direction of a semiconductor substrate and a drain withstand voltage of a vertical transistor.

FIG. 3 is a graph showing a relation between a position of a center of the first conductivity type layer 130 when viewed in the thickness direction of the semiconductor substrate 101 and a drain withstand voltage of the vertical transistor. Although the thickness of the first conductivity type layer 130 of each vertical transistor is different from one another, the on-resistance thereof is equal to each other. As shown in this figure, when the center position of the first conductivity type layer 130 overlaps between the bottom of the concave portion 142 and a bottom of the gate insulating film 170, i.e., with the bottom surface insulating film 172, the drain withstand voltage certainly becomes higher than in the case where the first conductivity type layer 130 is not provided. Therefore, the center position of the first conductivity type layer 130 is preferably overlapped with the bottom surface insulating film 172. However, when the first conductivity type layer 130 becomes too thick, the drain withstand voltage decreases as is apparent from FIG. 4 that will be mentioned later. Therefore, it is preferable that an upper limit of the thickness of the first conductivity type layer 130 is provided. Accordingly, it is preferable that at least one of the upper end and the lower end of the first conductivity type layer 130 is made to overlap with the bottom surface insulating film 172.

It should be noted that when the thickness of the first conductivity type layer 130 is set as t, and the impurity concentration of the first conductivity type layer 130 is set as N, it is preferable that an inequality of $t \times N < 1.25 \times 10^{16}$ $m^{-2}$ holds. The reason will be explained using FIGS. 4 and 5.

Figure 4:
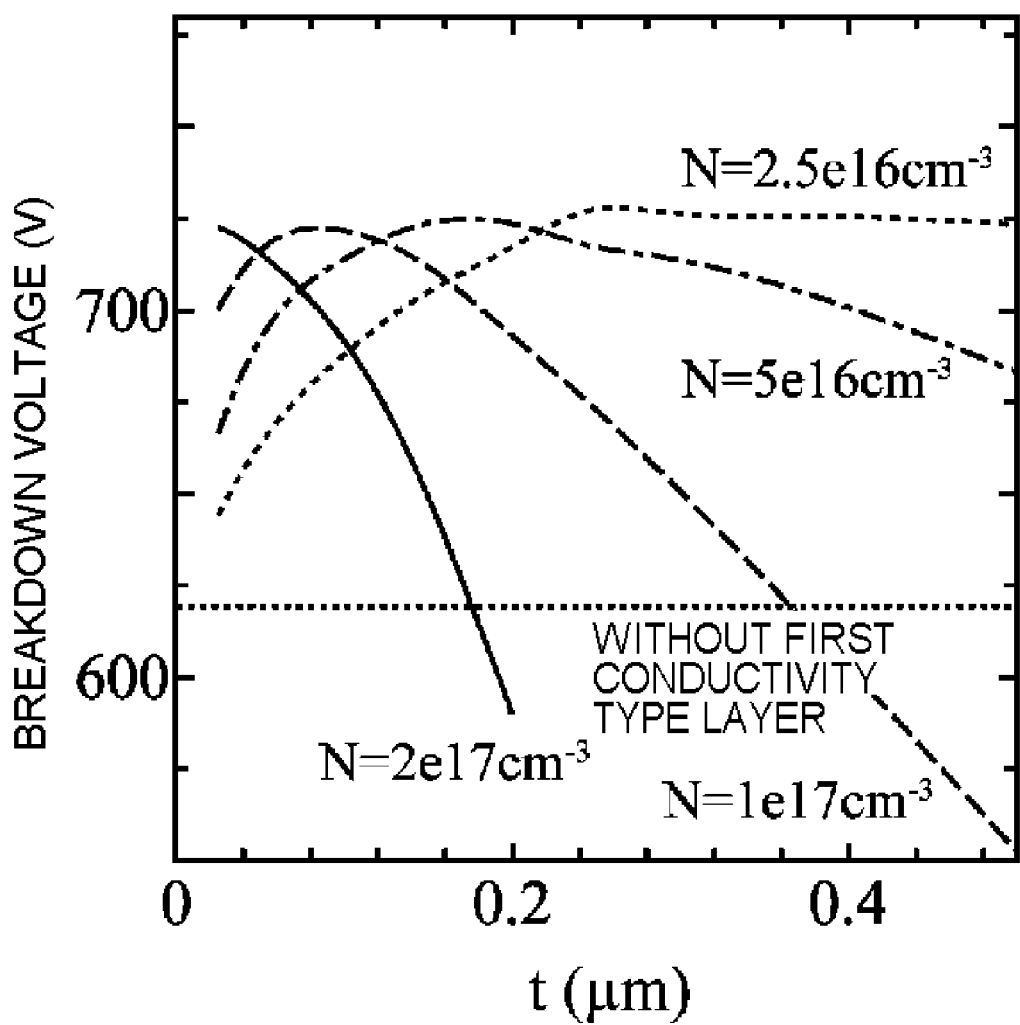
FIG. 4 is a graph showing an effect of a thickness t of the first conductivity type layer on the drain withstand voltage (breakdown voltage) of the vertical transistor.

FIG. 4 is a graph showing an effect of the thickness t of the first conductivity type layer 130 on the drain withstand voltage (breakdown voltage) of the vertical transistor. Note that, although in this figure, in each vertical transistor, the impurity concentration of the first conductivity type layer 130 is different from one another, the on-resistance thereof is equal to each other. As shown in this figure, the drain withstand voltage of the first conductivity type layer 130 becomes maximum when the thickness t becomes a certain value $t_{max}$. The thickness $t_{max}$ at this time changes depending on the impurity concentration N of the first conductivity type layer 130. In addition, when t becomes too thick, the drain withstand voltage of the first conductivity type layer 130 becomes lower than in the case where the first conductivity type layer 130 is not provided.

Figure 5:
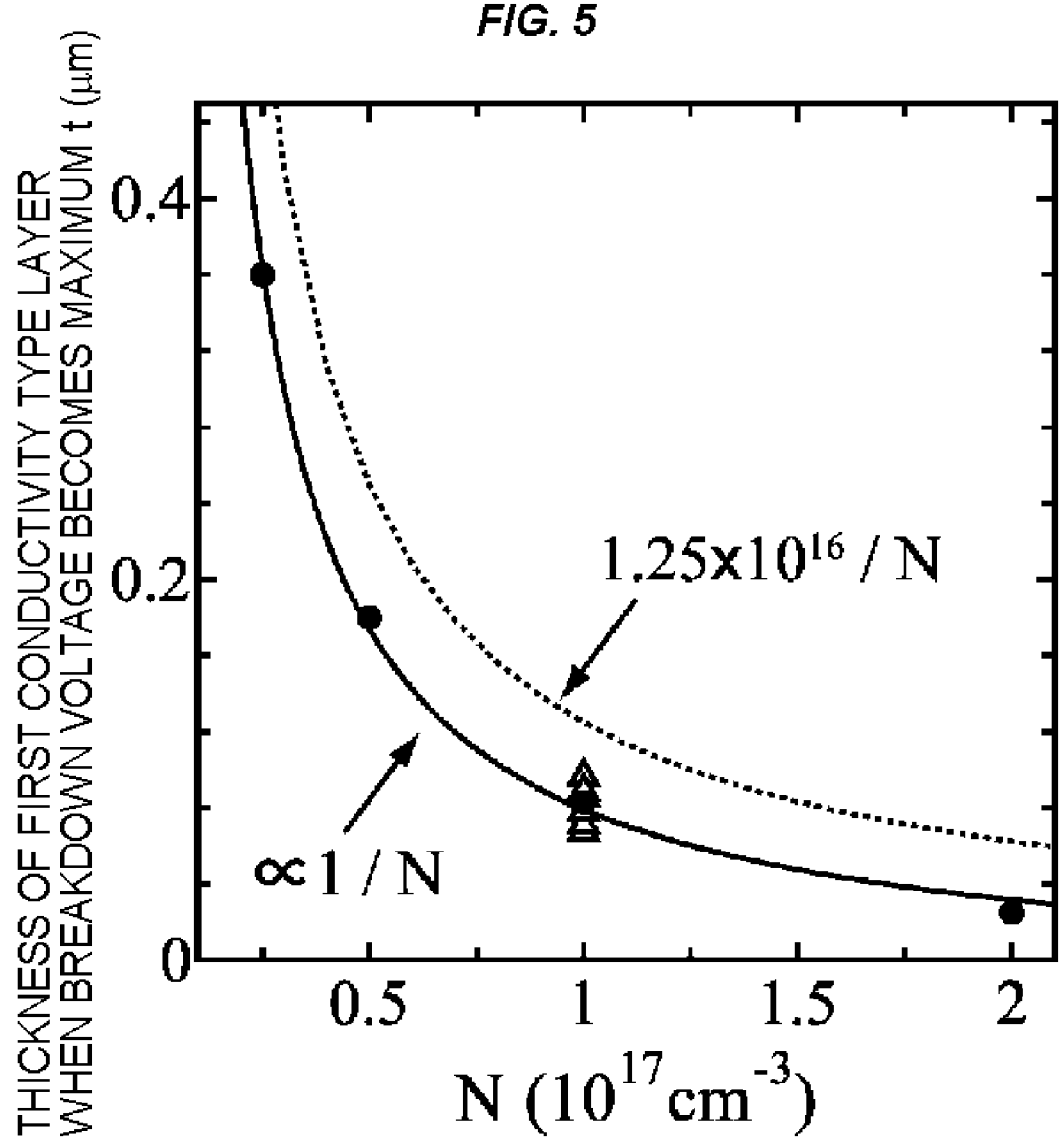
FIG. 5 is a graph showing a relation between a thickness $t_{max}$ of the first conductivity type layer and an impurity concentration N, when the drain withstand voltage becomes maximum.

FIG. 5 is a graph showing a relation between the thickness $t_{max}$ of the first conductivity type layer 130 and the impurity concentration N, when the drain withstand voltage becomes maximum. The thickness $t_{max}$ can be approximated by $(1.25 \times 10^{16}$ $m^{-2})/N$. As is apparent from this figure, when the inequality of $t \times N < 1.25 \times 10^{16}$ $m^{-2}$ is set, i.e., $t \times N$ is located on the left of a dotted line of FIG. 4, the drain withstand voltage certainly becomes larger than in the case where the first conductivity type layer 130 is not provided.

Figure 6:
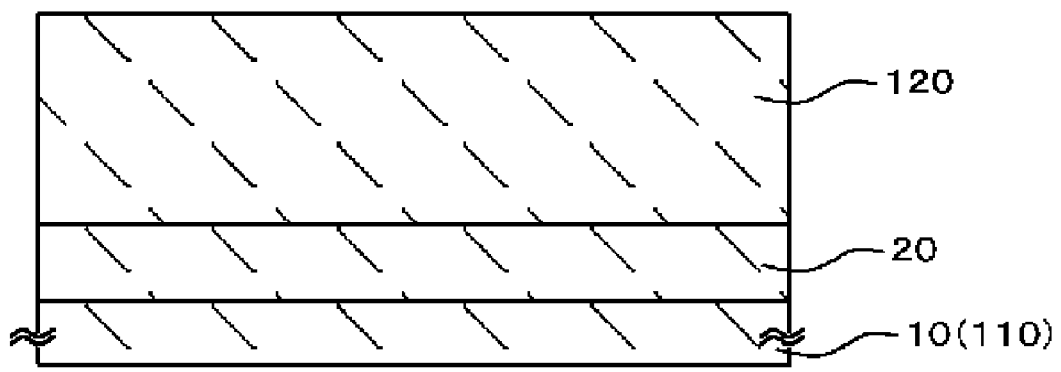
FIG. 6 is a cross-sectional view showing a method of manufacturing a semiconductor device.

Each of FIGS. 6 to 13 is a cross-sectional view showing a method of manufacturing the semiconductor device 100. First, as shown in FIG. 6, the substrate 10 in which the buffer layer 20 has been formed thereover is prepared. This step may be a step of forming the buffer layer 20 over the substrate 10, or may be a step of preparing a substrate formed at other places.

Next, the drift layer 120 is epitaxially grown over the buffer layer 20.

Figure 7:
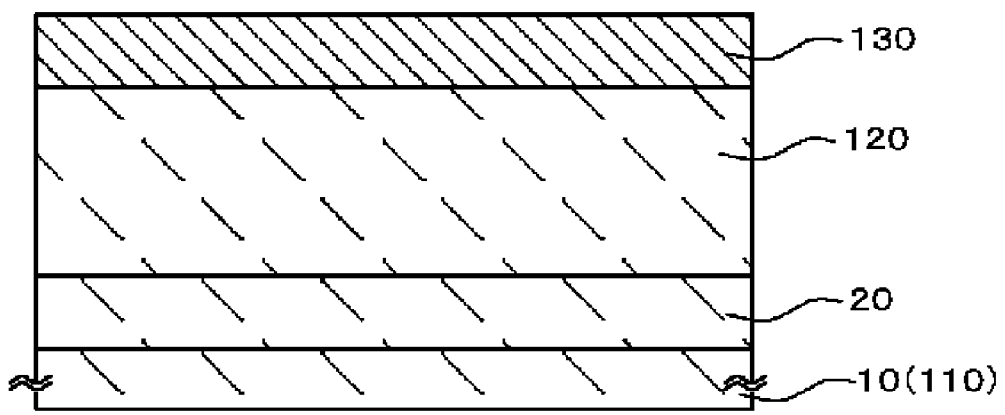
FIG. 7 is a cross-sectional view showing the method of manufacturing the semiconductor device.

Subsequently, as shown in FIG. 7, the first conductivity type layer 130 is epitaxially grown over the drift layer 120.

Figure 8:
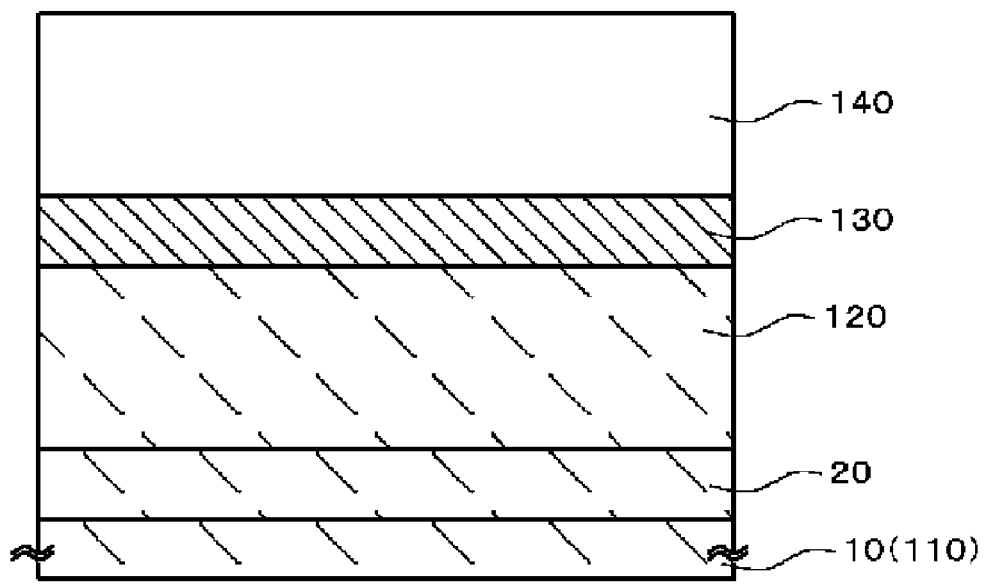
FIG. 8 is a cross-sectional view showing the method of manufacturing the semiconductor device.

After that, as shown in FIG. 8, the channel layer 140 is formed over the first conductivity type layer 130.

It should be noted that the drift layer 120, the first conductivity type layer 130, and the channel layer 140 can be continuously formed by changing composition of an atmosphere gas (for example, a type and a concentration of a doping gas) at the time of epitaxial growth.

Figure 9:
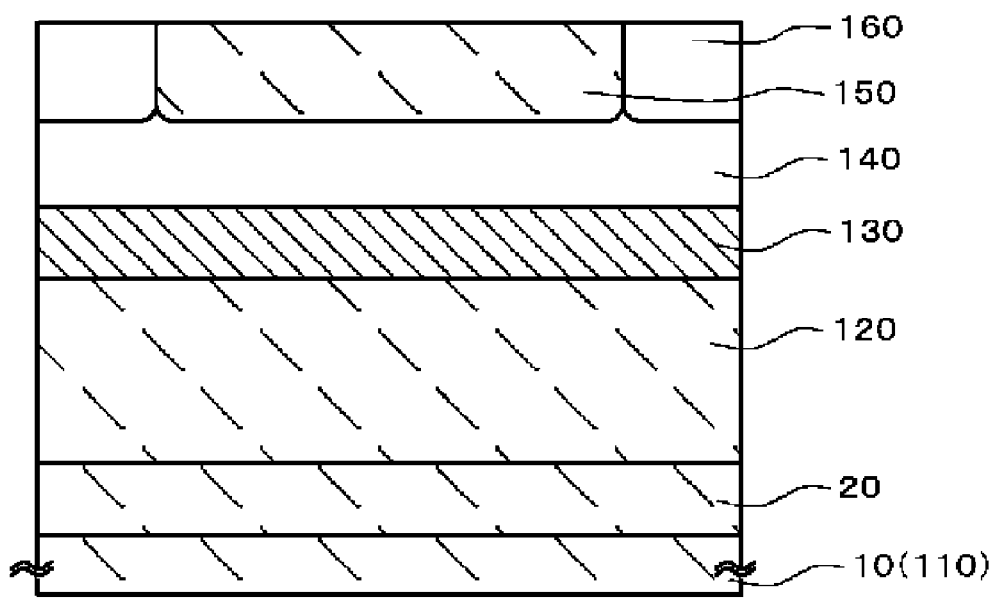
FIG. 9 is a cross-sectional view showing the method of manufacturing the semiconductor device.

Subsequently, as shown in FIG. 9, a first mask pattern (not shown) is formed over the channel layer 140, and an impurity is injected into the channel layer 140 by using the first mask pattern as a mask. When the channel layer 140 is a GaN-based compound semiconductor layer, the impurity is, for example, Mg. As a result, the base layer 160 is formed in the channel layer 140. Next, the first mask pattern is removed. After that, a second mask pattern (not shown) is formed over the channel layer 140, and an impurity is injected into the channel layer 140 by using the second mask pattern as a mask. As a result, the source layer 150 is formed in the channel layer 140. When the channel layer 140 is the GaN-based compound semiconductor layer, the impurity is, for example, Si. Subsequently, the second mask pattern is removed. It should be noted that the base layer 160 may be formed after the source layer 150 has been formed.

Figure 10:
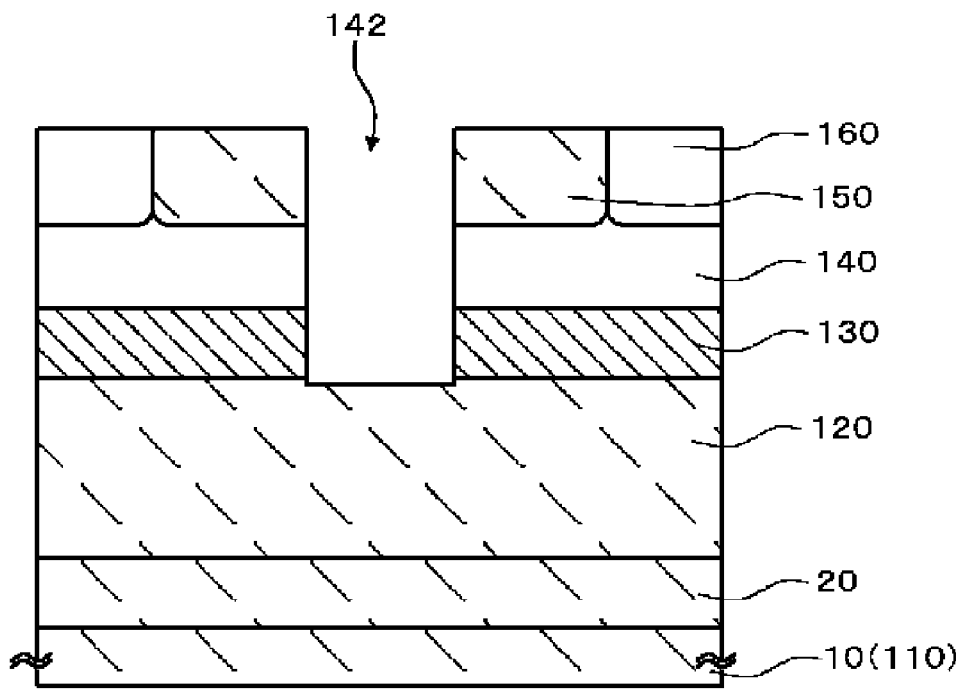
FIG. 10 is a cross-sectional view showing the method of manufacturing the semiconductor device.

Next, as shown in FIG. 10, a third mask pattern (not shown) is formed over the channel layer 140, and the channel layer 140 and the first conductivity type layer 130 are etched by using the third mask pattern as a mask. As a result, the concave portion 142 is formed in the channel layer 140 and the first conductivity type layer 130. After that, the third mask pattern is removed.

Figure 11:
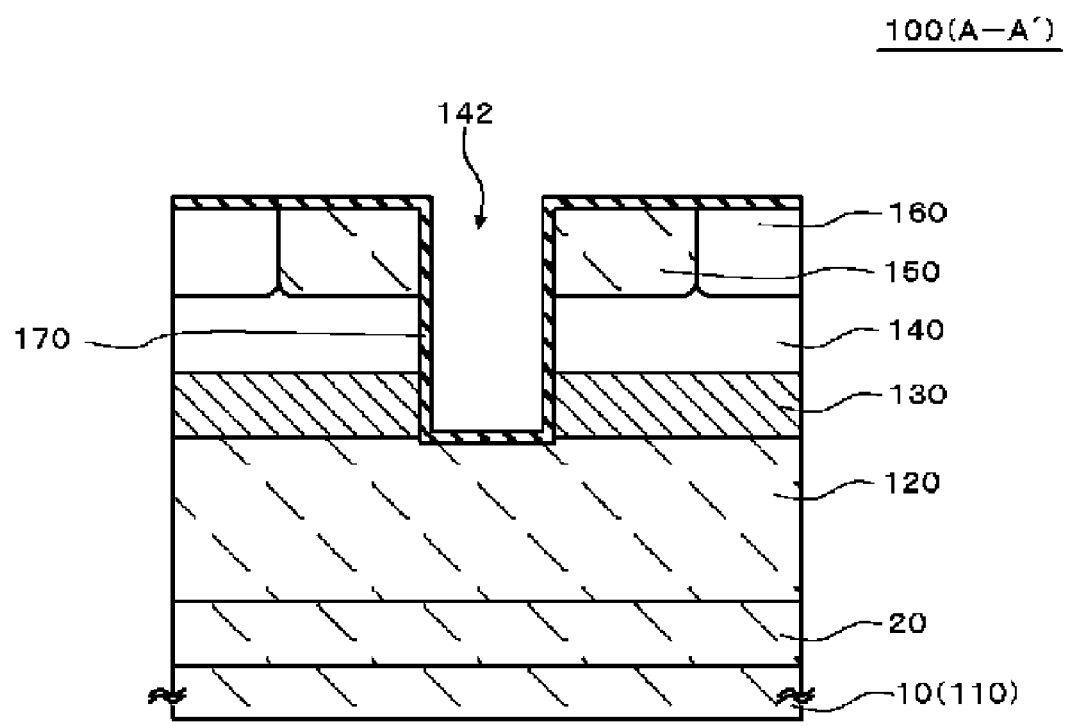
FIG. 11 is a cross-sectional view showing the method of manufacturing the semiconductor device.

Subsequently, as shown in FIG. 11, the gate insulating film 170 is formed on the side surface of the concave portion 142. In this step, a thickness of the gate insulating film 170 is formed thinner than a required thickness. The gate insulating film 170 shown in this figure is, for example, formed by an ALD (Atomic Layer Deposition) method. Therefore, the gate insulating film 170 is formed also on the bottom surface of the concave portion 142, over the source layer 150, and over the base layer 160 so as to have an approximately same thickness as the side surface of the concave portion 142. It should be noted that the gate insulating film 170 located on the bottom surface of the concave portion 142 serves as a part of the bottom surface insulating film 172.

Figure 12:
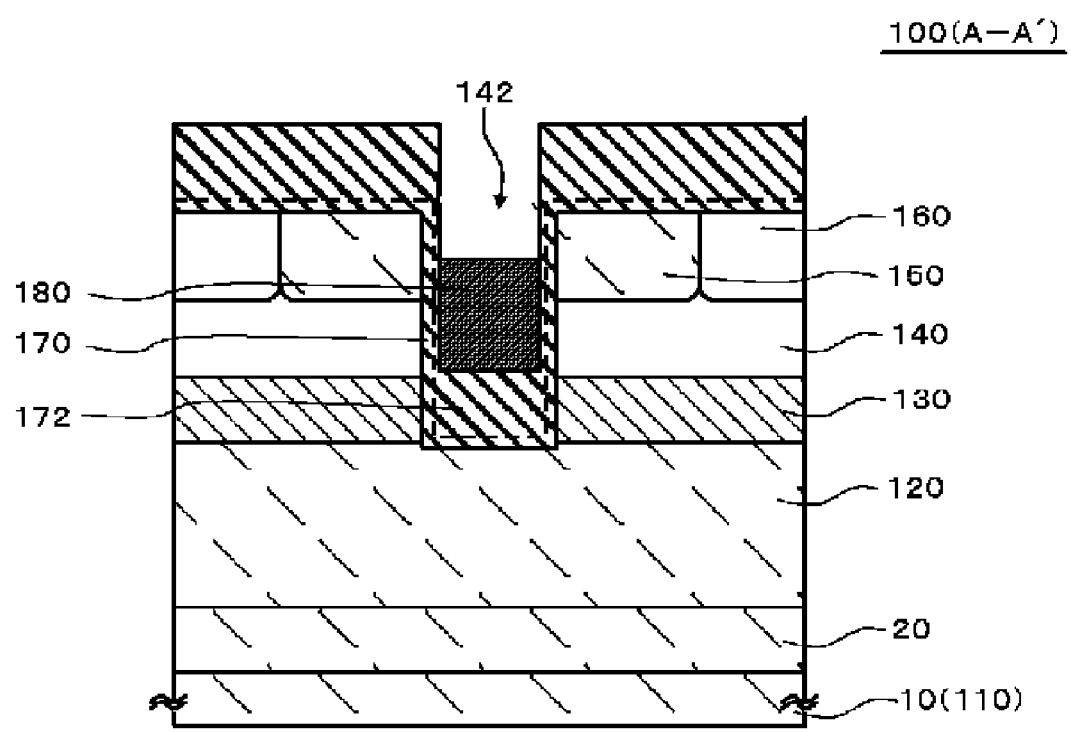
FIG. 12 is a cross-sectional view showing the method of manufacturing the semiconductor device.

After that, as shown in FIG. 12, the bottom surface insulating film 172 is formed over the gate insulating film 170 by a CVD method. The bottom surface insulating film 172 may be formed of the same material as the gate insulating film 170, or maybe formed of a material different therefrom. In this step, the bottom surface insulating film 172 is formed thin over the side surface of the concave portion 142, but it is formed thick over the bottom surface of the concave portion 142. Additionally, a portion of the bottom surface insulating film 172 formed over the side surface of the concave portion 142 serves as a part of the gate insulating films 170. It should be noted that in the step, the bottom surface insulating film 172 is formed also over the source layer 150 and the base layer 160.

Figure 13:
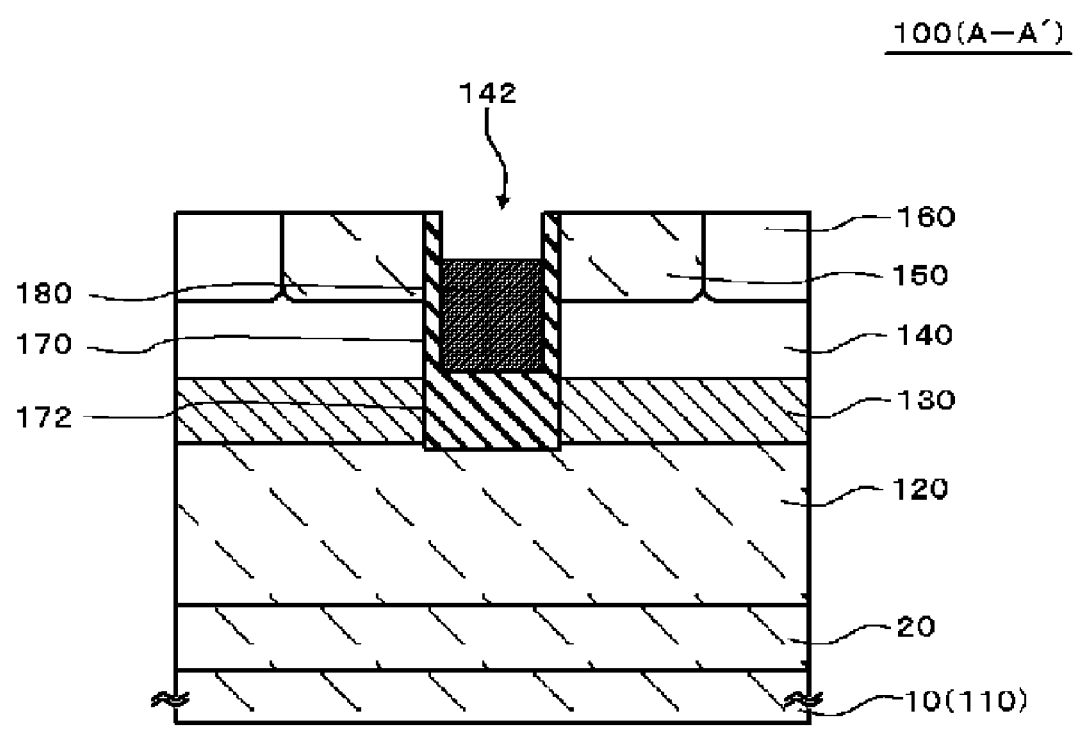
FIG. 13 is a cross-sectional view showing the method of manufacturing the semiconductor device.

Next, as shown in FIG. 13, a film that serves as the gate electrode 180 is formed inside the concave portion 142. In this step, the film is formed also over the source layer 150 and the base layer 160. Subsequently, portions of the film that serves as the gate electrode 180, the gate insulating film 170, and the bottom surface insulating film 172 that are located over the source layer 150 and the base layer 160 are removed by etching. The gate electrode 180 is formed by this step. Note that the upper surface of the gate electrode 180 is formed lower than an upper end of the channel layer 140.

Subsequently, an insulating film is formed by the CVD method in a space of the concave portion 142 located over the gate electrode 180, and over the source layer 150 and the base layer 160. Next, portions of the insulating film that are located over the source layer 150 and the base layer 160 are removed by etching. As a result, the interlayer insulating film 190 shown in FIG. 2 is formed. Subsequently, the drain electrode 210 and the source electrode 220 are formed. As a result, the semiconductor device 100 shown in FIG. 2 is formed.

Hereinbefore, according to the present embodiment, the first conductivity type layer 130 is provided between the drift layer 120 and the channel layer 140. The impurity concentration of the first conductivity type layer 130 is higher than that of the drift layer 120. Accordingly, the on-resistance of the vertical transistor becomes low. In addition, the center position of the first conductivity type layer 130 overlaps with the bottom surface insulating film 172, and at least one of the upper end and the lower end of the first conductivity type layer 130 overlaps with the bottom surface insulating film 172. Therefore, decrease of the drain withstand voltage of the vertical transistor due to the first conductivity type layer 130 can be suppressed.

Figure 14:
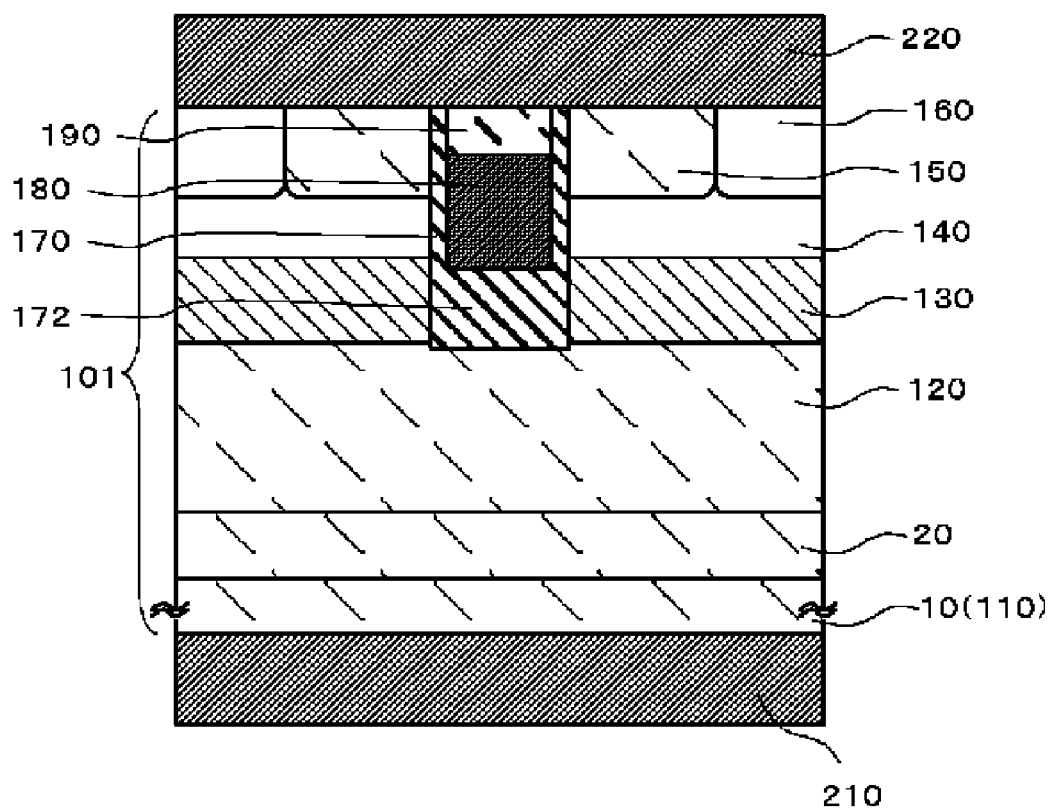
FIG. 14 is a view showing a modification of FIG. 1.
Figure 15:
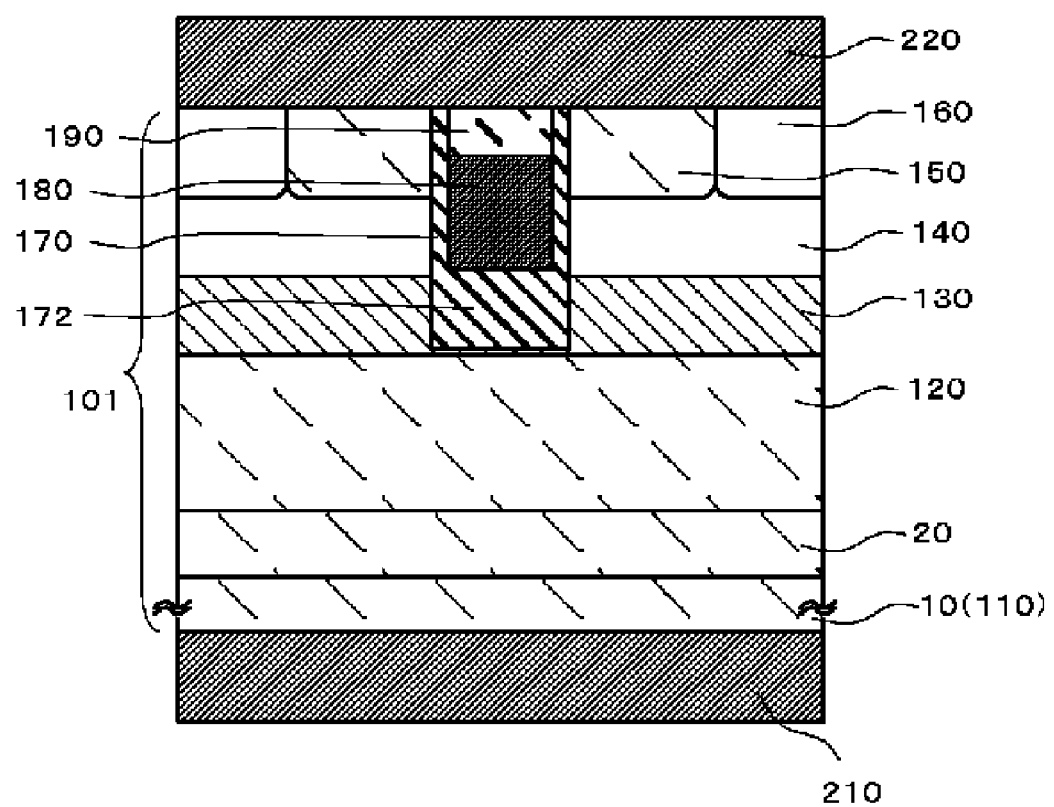
FIG. 15 is a view showing the modification of FIG. 1.
Figure 16:
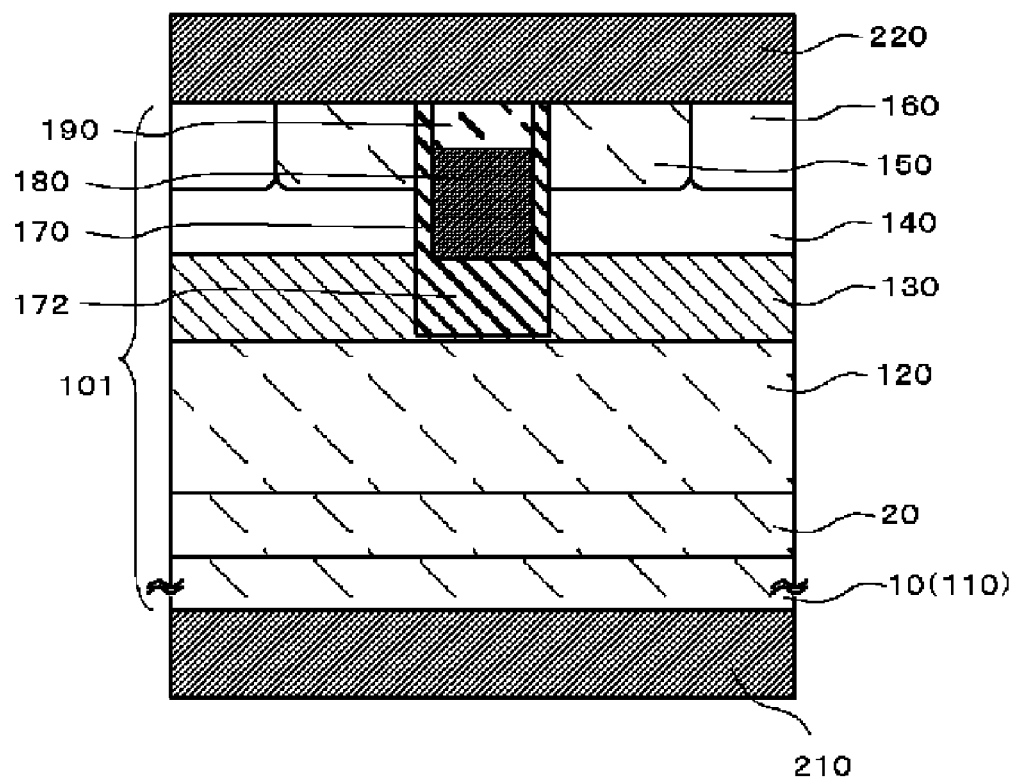
FIG. 16 is a view showing the modification of FIG. 1.

Note that, as shown in FIG. 14, when viewed in the thickness direction of the semiconductor substrate 101, the lower end of the first conductivity type layer 130 may overlap with the bottom surface insulating film 172, but the upper end thereof may not overlap with the bottom surface insulating film 172. In addition, as shown in FIG. 15, the upper end of the first conductivity type layer 130 may overlap with the bottom surface insulating film 172, but the lower end thereof may not overlap with the bottom surface insulating film 172. Furthermore, as shown in FIG. 16, both of the upper end and the lower end of the first conductivity type layer 130 do not necessarily overlap with the bottom surface insulating film 172. In any case, it is necessary to place an upper limit of the thickness of the first conductivity type layer 130 in order to obtain the above-described effect. For example, it is preferable that a thickness of a portion of the first conductivity type layer 130 that does not overlap with the bottom surface insulating film 172 is not more than 10% of the thickness of the first conductivity type layer 130. A position of the first conductivity type layer 130 shown in FIGS. 14 to 16 is applicable also in each embodiment that will be mentioned later.

Second Embodiment

Figure 17:
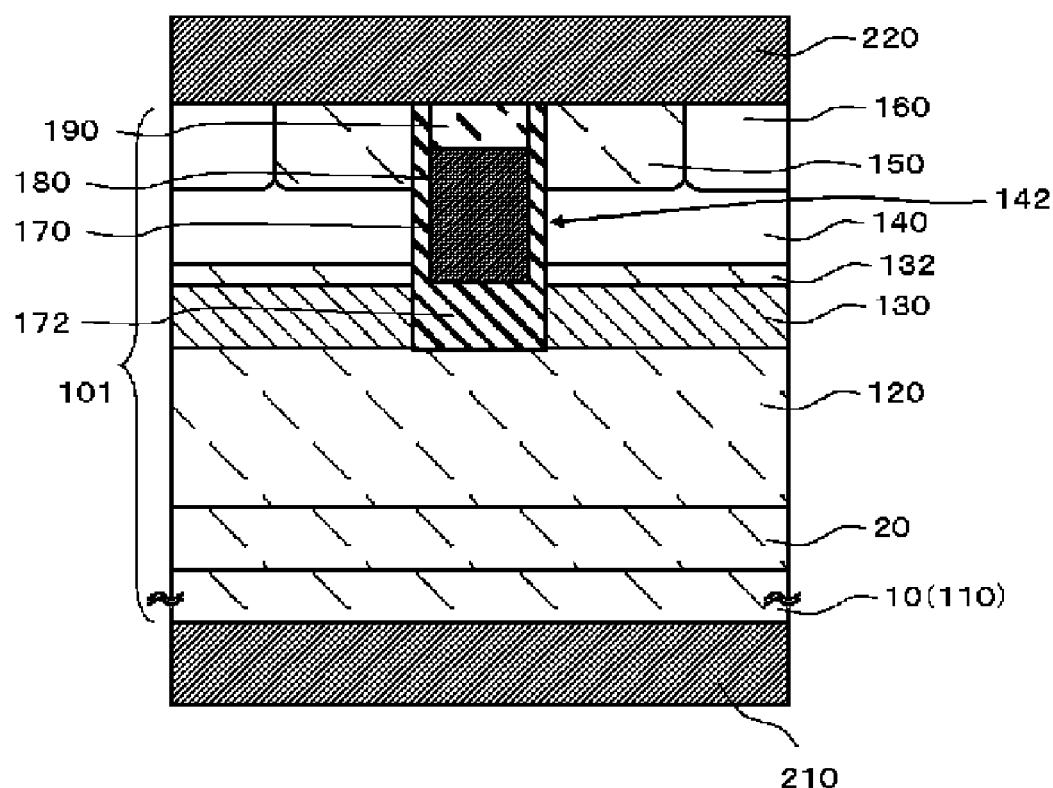
FIG. 17 is a cross-sectional view showing a configuration of a semiconductor device according to a second embodiment.

FIG. 17 is a cross-sectional view showing a configuration of the semiconductor device 100 according to a second embodiment, and it corresponds to FIG. 2 in the first embodiment. The semiconductor device 100 according to the present embodiment has the configuration similar to that in the semiconductor device 100 according to the first embodiment except for having an interlayer 132.

The interlayer 132 is located between the first conductivity type layer 130 and the channel layer 140. In the present embodiment, the interlayer 132 is thinner than the first conductivity type layer 130. The interlayer 132 is, for example, a first conductivity type layer having an impurity concentration lower than that in the first conductivity type layer 130. An impurity concentration of the interlayer 132 is, for example, the same as that of the drift layer 120. In addition, when viewed in the thickness direction of the semiconductor substrate 101, the lower end of the gate electrode 180 is located in the interlayer 132.

Figure 18:
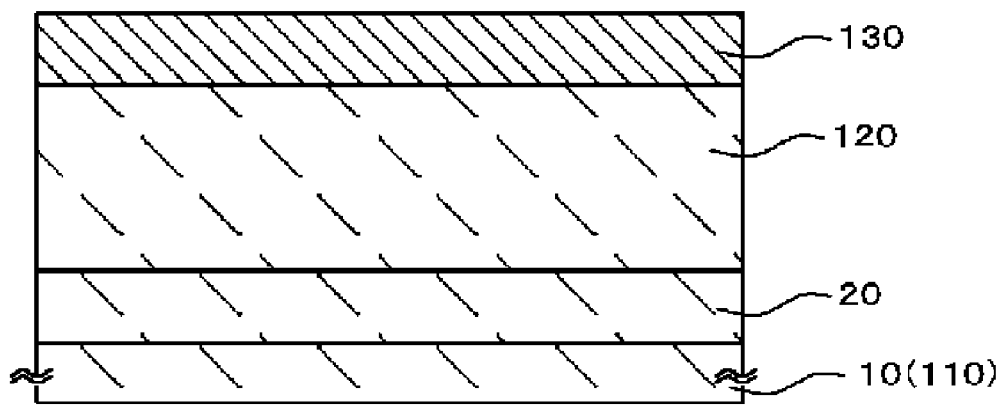
FIG. 18 is a cross-sectional view showing a method of manufacturing the semiconductor device shown in FIG. 17.
Figure 19:
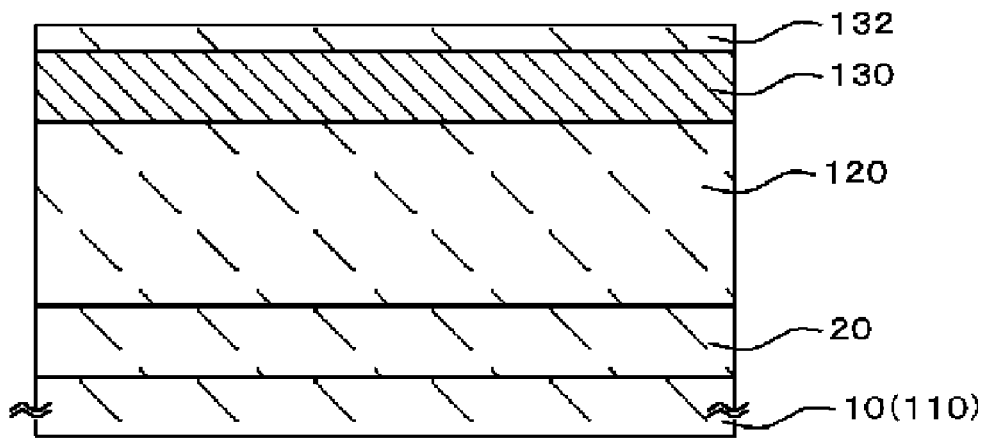
FIG. 19 is a cross-sectional view showing the method of manufacturing the semiconductor device shown in FIG. 17.
Figure 20:
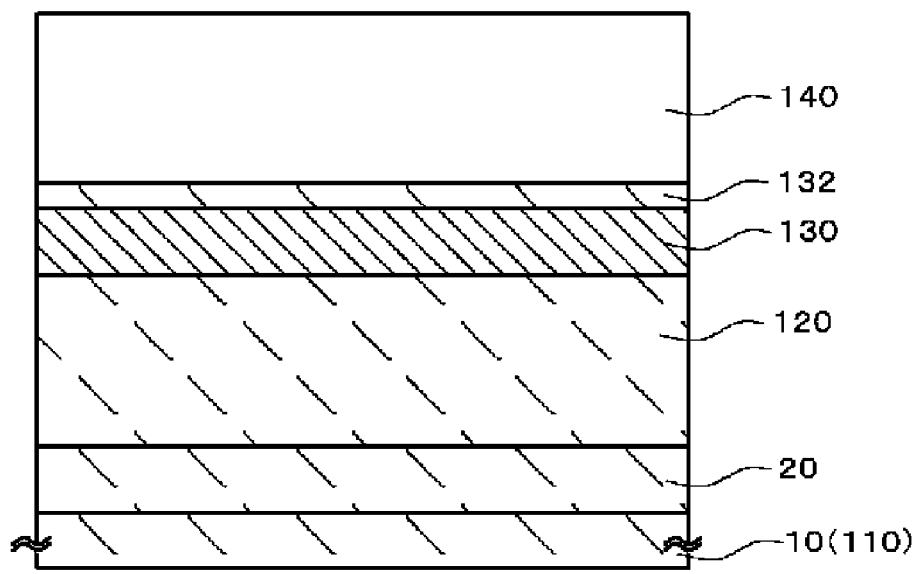
FIG. 20 is a cross-sectional view showing the method of manufacturing the semiconductor device shown in FIG. 17.

FIGS. 18 to 20 are cross-sectional views showing a method of manufacturing the semiconductor device 100 shown in FIG. 17. First, as shown in FIG. 18, the drift layer 120 and the first conductivity type layer 130 are formed over the buffer layer 20. The steps so far are similar to those in the first embodiment.

Next, as shown in FIG. 19 the interlayer 132 is epitaxially grown over the first conductivity type layer 130. Next, as shown in FIG. 20, the channel layer 140 is epitaxially grown over the interlayer 132. It should be noted that the first conductivity type layer 130, the interlayer 132, and the channel layer 140 can be continuously grown.

The subsequent steps are similar to those in the first embodiment.

Also according to the present embodiment, an effect similar to that in the first embodiment can be obtained. In addition, according to the present embodiment, the interlayer 132 is formed between the first conductivity type layer 130 and the channel layer 140. The interlayer 132 has the first conductivity type, and the impurity concentration thereof is lower than the first conductivity type layer 130. Therefore, it becomes unnecessary to align the lower end of the channel layer 140 with the lower end of the gate electrode 180. Accordingly, it becomes easy to manufacture the semiconductor device 100. It should be noted that the interlayer 132 may be an intrinsic semiconductor layer, or a p-type impurity layer having an impurity concentration lower than that in the channel layer 140.

Third Embodiment

Figure 21:
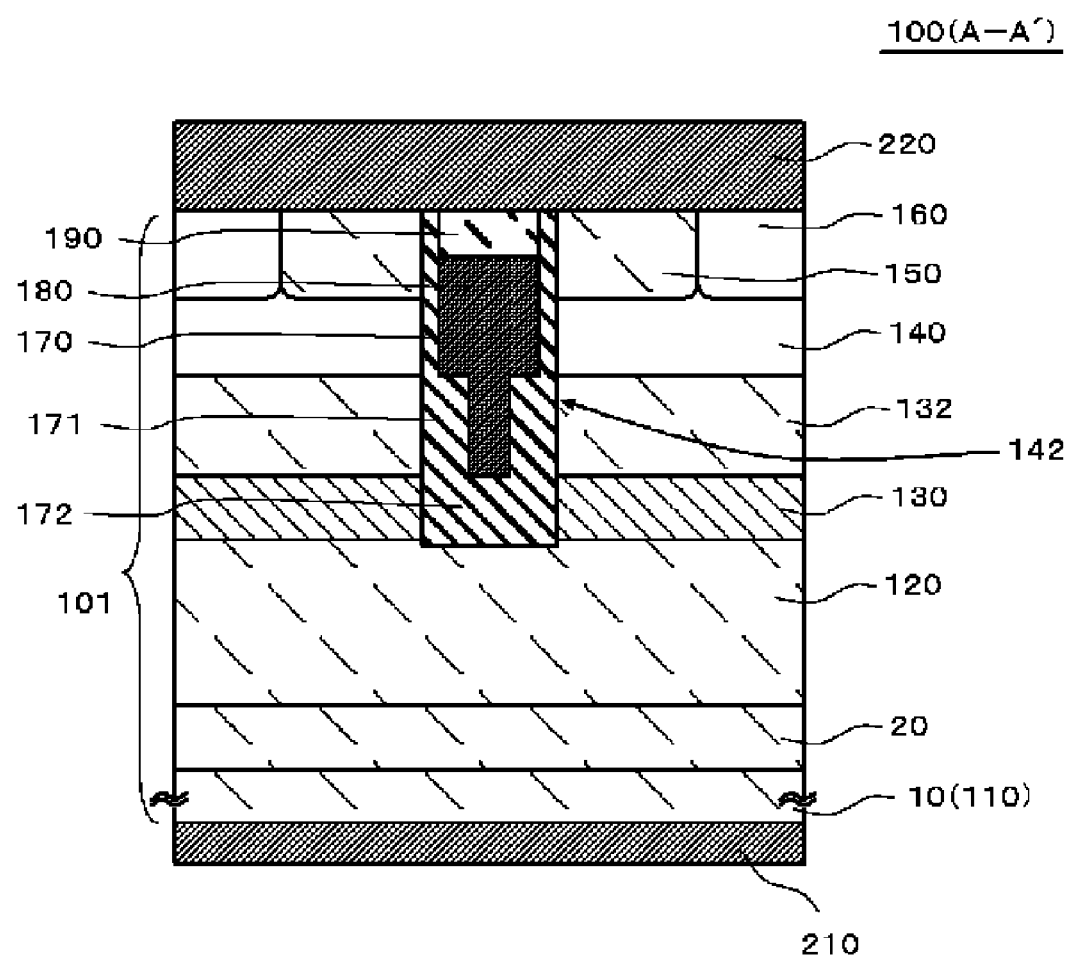
FIG. 21 is a cross-sectional view showing a configuration of a semiconductor device according to a third embodiment.

FIG. 21 is a cross-sectional view showing a configuration of the semiconductor device 100 according to a third embodiment, and it corresponds to FIG. 17 in the second embodiment. The semiconductor device 100 according to the present embodiment has the configuration similar to that in the semiconductor device 100 according to the second embodiment except for the following points.

First, a concave portion is formed in the bottom surface insulating film 172, and a lower portion of the gate electrode 180 has entered the concave portion. That is, an upper portion of the bottom surface insulating film 172 functions as a field plate insulating film 171 (thick film portion). In other words, the field plate insulating film 171 is linked to the gate insulating film. 170, and is thicker than the gate insulating film 170. In addition, a lower end of the field plate insulating film 171 is linked to the bottom surface insulating film 172. When viewed in the thickness direction of the semiconductor substrate 101, it is preferable that the upper end and the lower end of the field plate insulating film 171 are located inside the interlayer 132. It should be noted that when it is necessary to increase a length (a vertical direction in FIG. 21) of the field plate insulating film 171, the interlayer 132 also becomes thicker in accordance with that. In this case, the interlayer 132 may become thicker than the first conductivity type layer 130.

Figure 22:
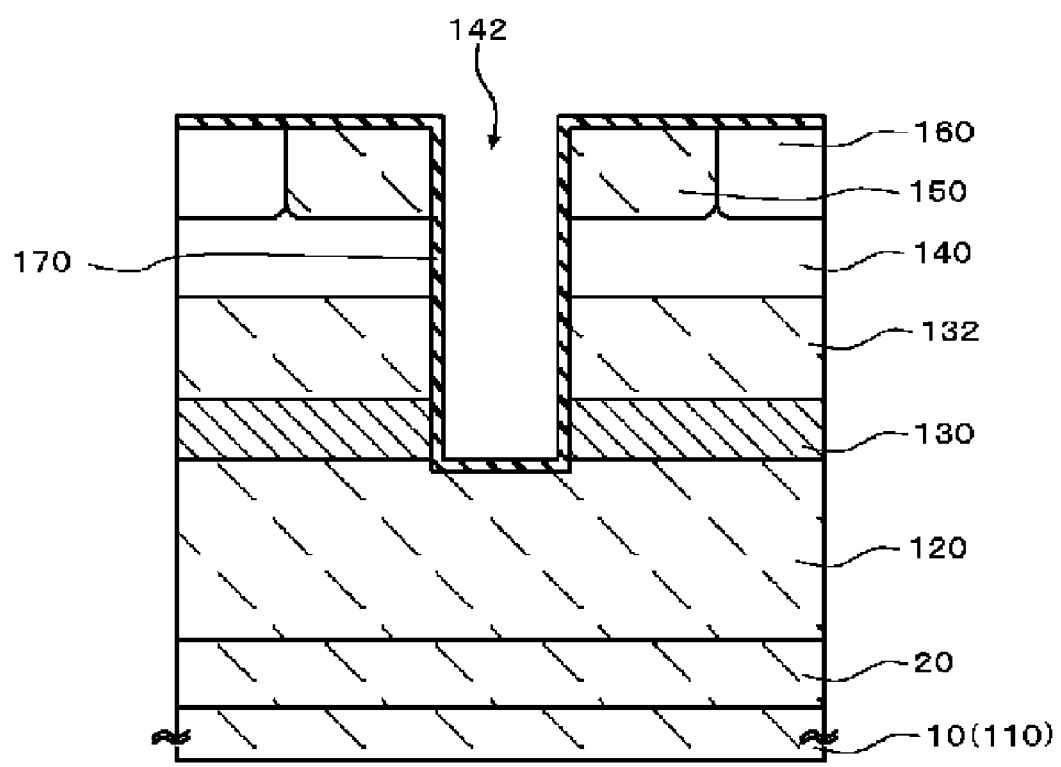
FIG. 22 is a cross-sectional view showing a method of manufacturing the semiconductor device shown in FIG. 21.
Figure 23:
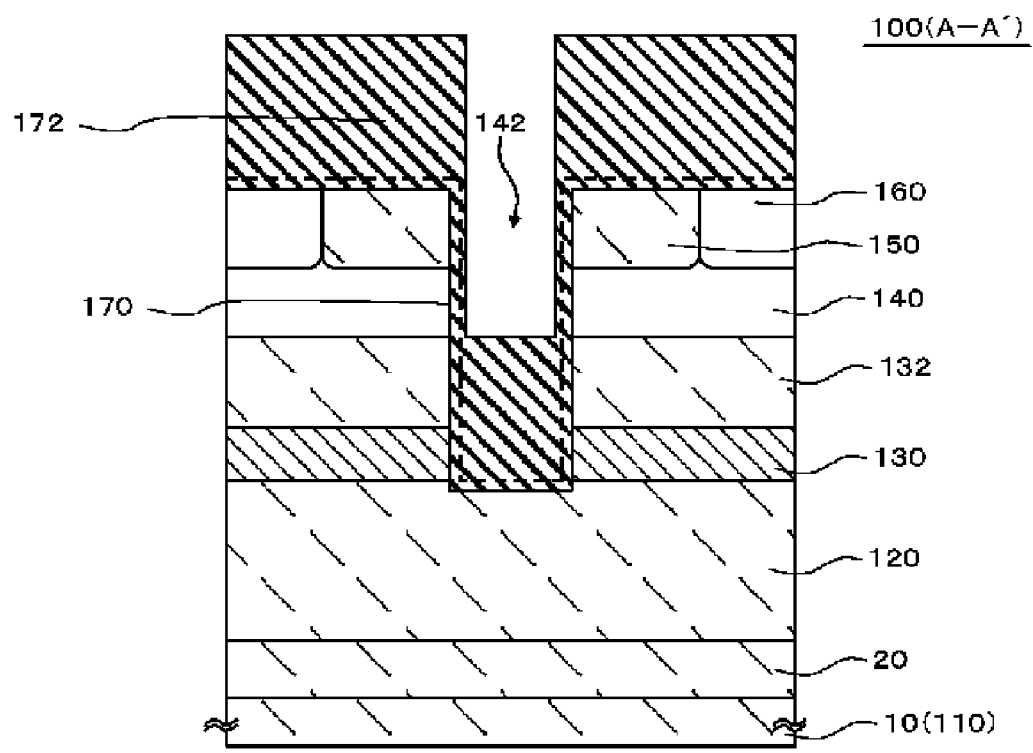
FIG. 23 is a cross-sectional view showing the method of manufacturing the semiconductor device shown in FIG. 21.
Figure 24:
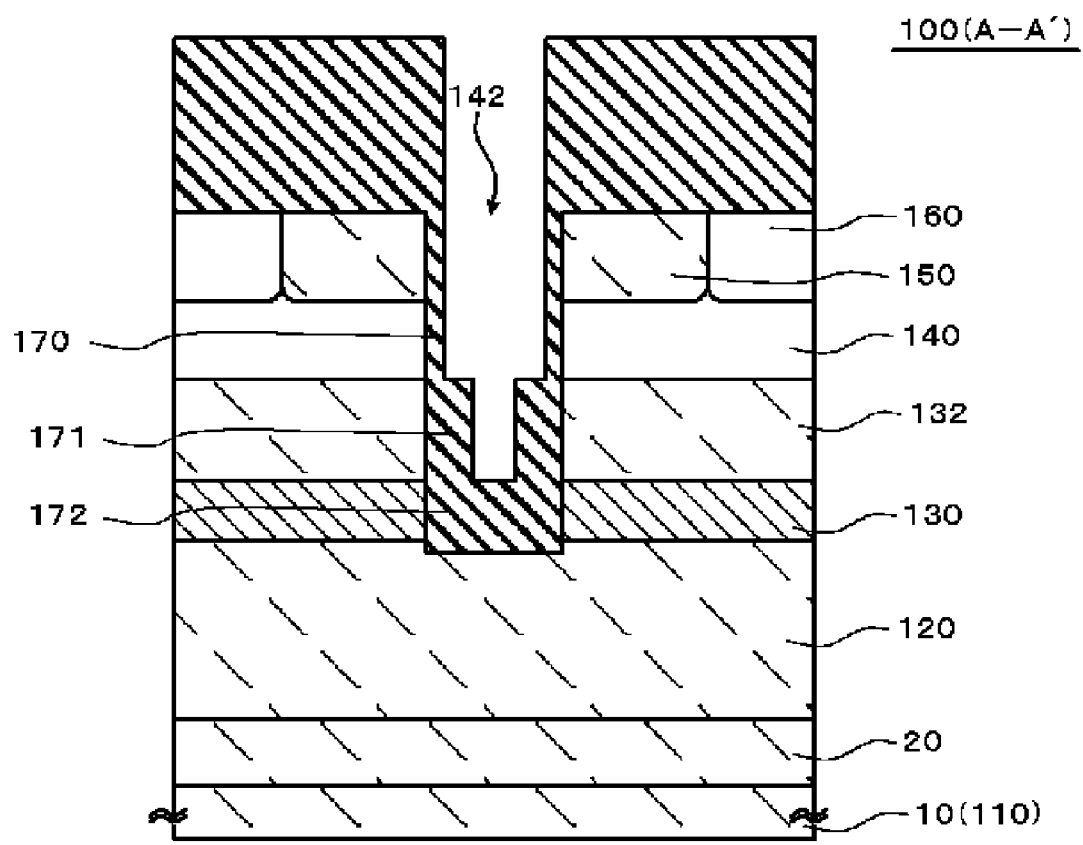
FIG. 24 is a cross-sectional view showing the method of manufacturing the semiconductor device shown in FIG. 21.

FIGS. 22 to 24 are cross-sectional views showing a method of manufacturing the semiconductor device 100 shown in FIG. 21. As shown in FIG. 22, steps until the gate insulating film 170 is formed by the ALD method are similar to those in the second embodiment.

Next, as shown in FIG. 23, the bottom surface insulating film 172 is formed over the gate insulating film 170. The step is also similar to that in the second embodiment.

Next, as shown in FIG. 24, a resist pattern is formed over the bottom surface insulating film 172, and the bottom surface insulating film 172 is etched by using the resist pattern as a mask. As a result, the concave portion is formed in a bottom of the bottom surface insulating film 172. The bottom surface insulating film 172 located on a side surface of the concave portion serves as the field plate insulating film 171. In a manner described above, the gate insulating film 170, the field plate insulating film 171, and the bottom surface insulating film 172 are formed.

Subsequent steps are similar to those in the second embodiment.

Also according to the present embodiment, an effect similar to that in the second embodiment can be obtained. In addition, since the field plate insulating film 171 is provided, the concentration of an electric field on the portion of the gate insulating film 170 facing the lower end of the gate electrode 180 can be suppressed. It should be noted that in the first embodiment, the field plate insulating film 171 shown in the present embodiment may be provided.

Fourth Embodiment

Figure 25:
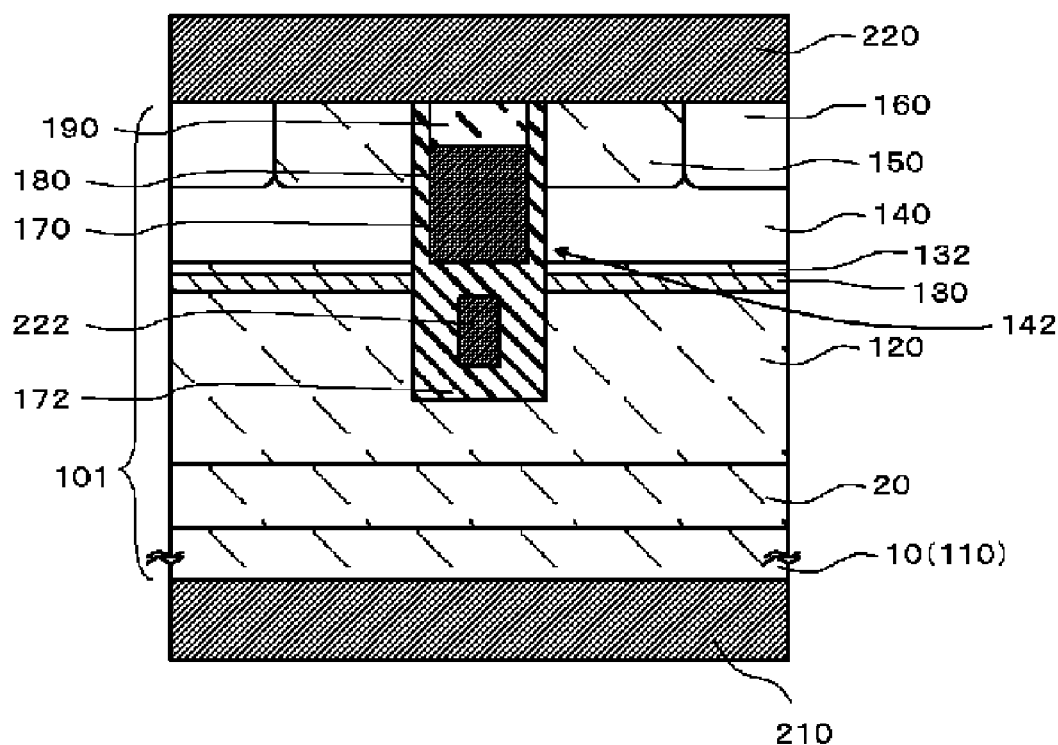
FIG. 25 is a cross-sectional view showing a configuration of a semiconductor device according to a fourth embodiment.
Figure 26:
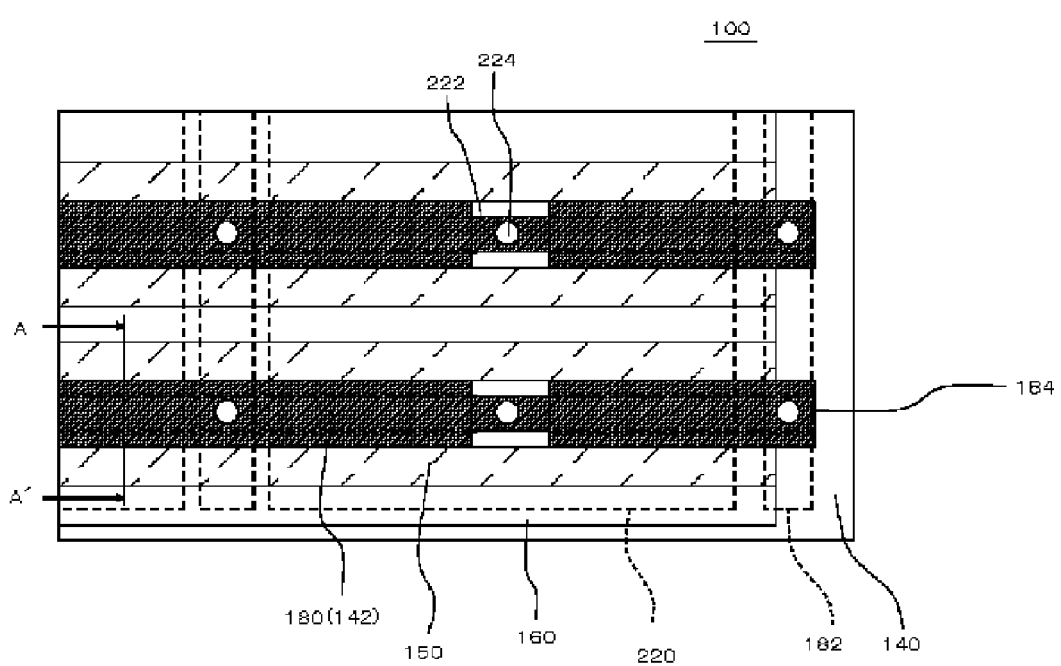
FIG. 26 is a plan view of the semiconductor device shown in FIG. 25.

FIG. 25 is a cross-sectional view showing a configuration of the semiconductor device 100 according to a fourth embodiment. FIG. 26 is a plan view of the semiconductor device 100 shown in FIG. 25. Note that FIG. 25 shows a cross-section taken along a line A-A' of FIG. 26. The semiconductor device 100 according to the present embodiment has the configuration similar to that in the semiconductor device 100 according to the second embodiment except for having a field plate electrode 222.

The field plate electrode 222 is buried in the bottom surface insulating film 172. That is, the field plate electrode 222 extends in parallel with the gate electrode 180, and is insulated from the gate electrode 180 by the bottom surface insulating film 172. A width of the field plate electrode 222 is smaller than a width of the gate electrode 180. In addition, when viewed in the thickness direction of the semiconductor substrate 101, the field plate electrode 222 is located inside the drift layer 120.

As shown in FIG. 26, although the gate electrode 180 is separated at a portion overlapping with the source electrode 220 when viewed from a plane, the field plate electrode 222 is not separated even at the portion. Additionally, the field plate electrode 222 is coupled to the source electrode 220 via a contact 224 in the portion where the gate electrode 180 has been separated. That is, the same electric potential as those in the source layer 150 and the channel layer 140 is applied to the field plate electrode 222, via the contact 224.

FIGS. 27 to 30 are cross-sectional views showing a method of manufacturing the semiconductor device 100 shown in FIGS. 25 and 26. In the method of manufacturing this semiconductor device 100, steps until the gate insulating film 170 is formed by the ALD method are similar to those in the third embodiment.

Figure 27:
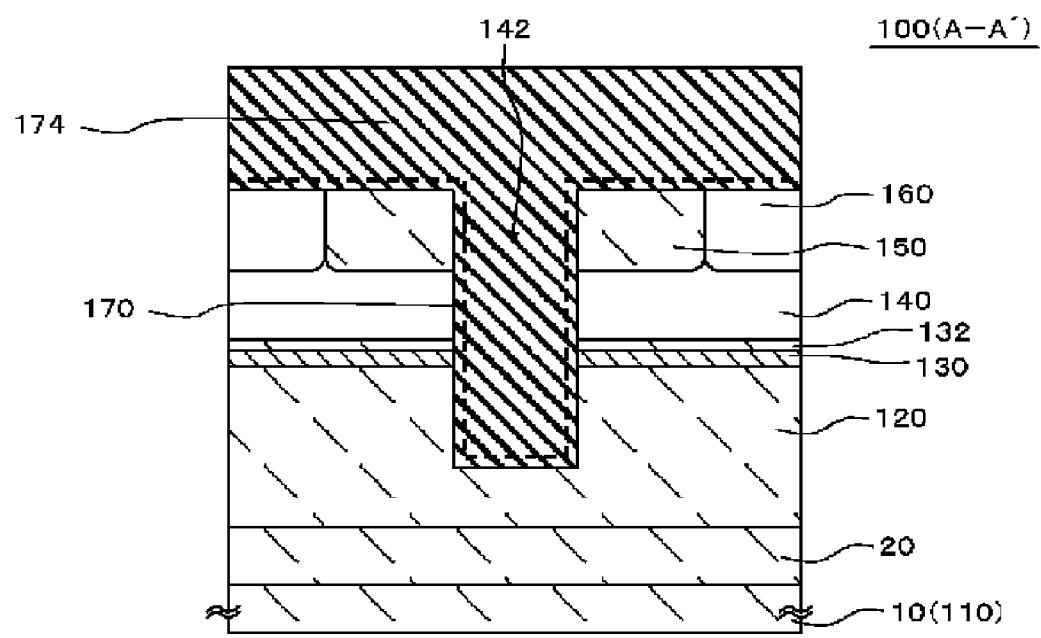
FIG. 27 is a cross-sectional view showing a method of manufacturing the semiconductor device shown in FIGS. 25 and 26.

After the gate insulating film 170 is formed by the ALD method, an insulating film 174 is formed over the gate insulating film 170 as shown in FIG. 27. In this step, the concave portion 142 is completely filled with the insulating film 174, and the insulating film 174 is formed also over the source layer 150 and the base layer 160.

Figure 28:
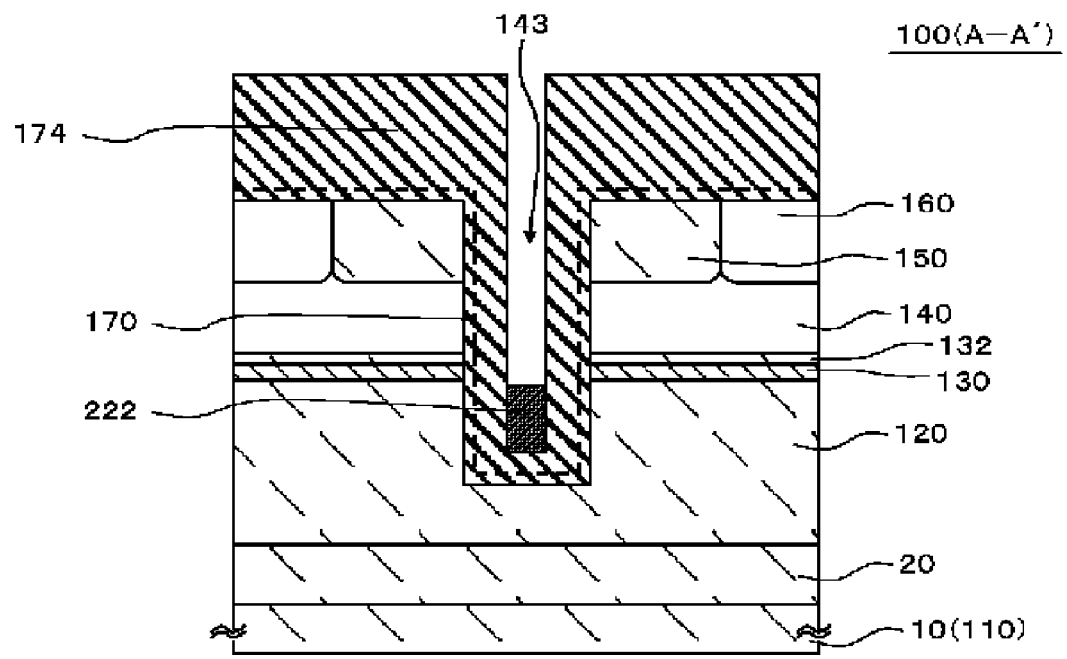
FIG. 28 is a cross-sectional view showing the method of manufacturing the semiconductor device shown in FIGS. 25 and 26.

Next, as shown in FIG. 28, a resist pattern (not shown) is formed over the insulating film 174, and the insulating film 174 is etched by using the resist pattern as a mask. As a result, a concave portion 143 is formed in the insulating film 174. The concave portion 143 is located in the concave portion 142. A lower end of the concave portion 143 has reached the drift layer 120.

Subsequently, a conductive film, such as a polysilicon film, is formed in the concave portion 143 and over the insulating film 174, and the conductive film is selectively removed. As a result, the field plate electrode 222 is buried in the concave portion 143.

Figure 29:
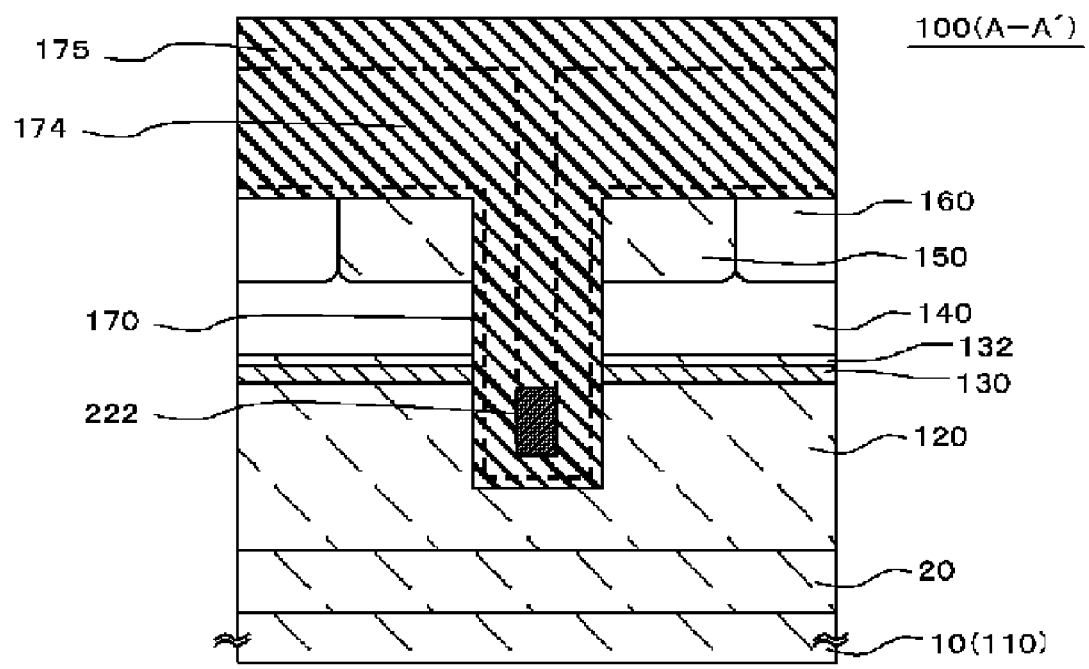
FIG. 29 is a cross-sectional view showing the method of manufacturing the semiconductor device shown in FIGS. 25 and 26.

After that, as shown in FIG. 29, an insulating film 175 is buried in the concave portion 143. In this step, the insulating film 175 is formed also over the insulating film 174.

Figure 30:
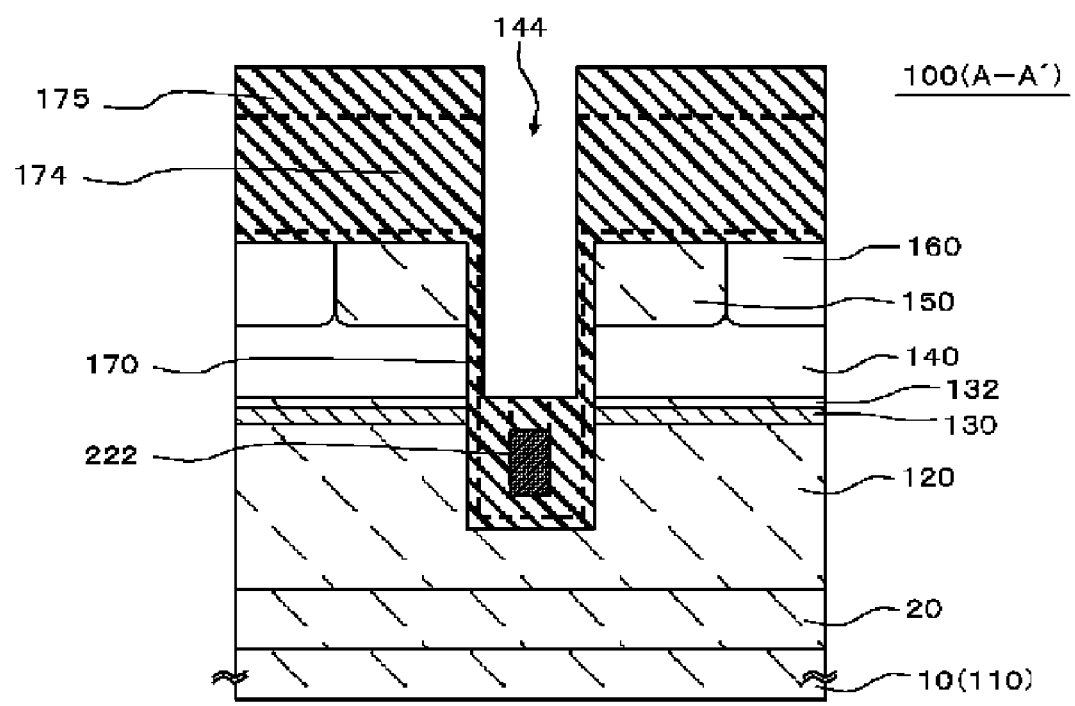
FIG. 30 is a cross-sectional view showing the method of manufacturing the semiconductor device shown in FIGS. 25 and 26.

Next, as shown in FIG. 30, a concave portion 144 is formed in a stacked film of the insulating film 175 and the insulating film 174. In a planar view, the concave portion 144 is located in the concave portion 142. In addition, a lower end of the concave portion 144 has not reached the field plate electrode 222. As a result, a thickness of the gate insulating film 170 becomes a required one.

Subsequently, the gate electrode 180 and the interlayer insulating film 190 are buried in the concave portion 144. This step is similar to the step of burying the gate electrode 180 and the interlayer insulating film 190 in the concave portion 142 in the second embodiment. Subsequent steps are similar to those in the second embodiment.

Also according to the present embodiment, an effect similar to that in the second embodiment can be obtained. In addition, since the field plate electrode 222 is buried in the bottom surface insulating film 172, the concentration of an electric field on the portion of the gate insulating film 170 facing the lower end of the gate electrode 180 can be suppressed. It should be noted that the field plate electrode 222 shown in the present embodiment may be provided in the first embodiment.

Fifth Embodiment

Figure 31:
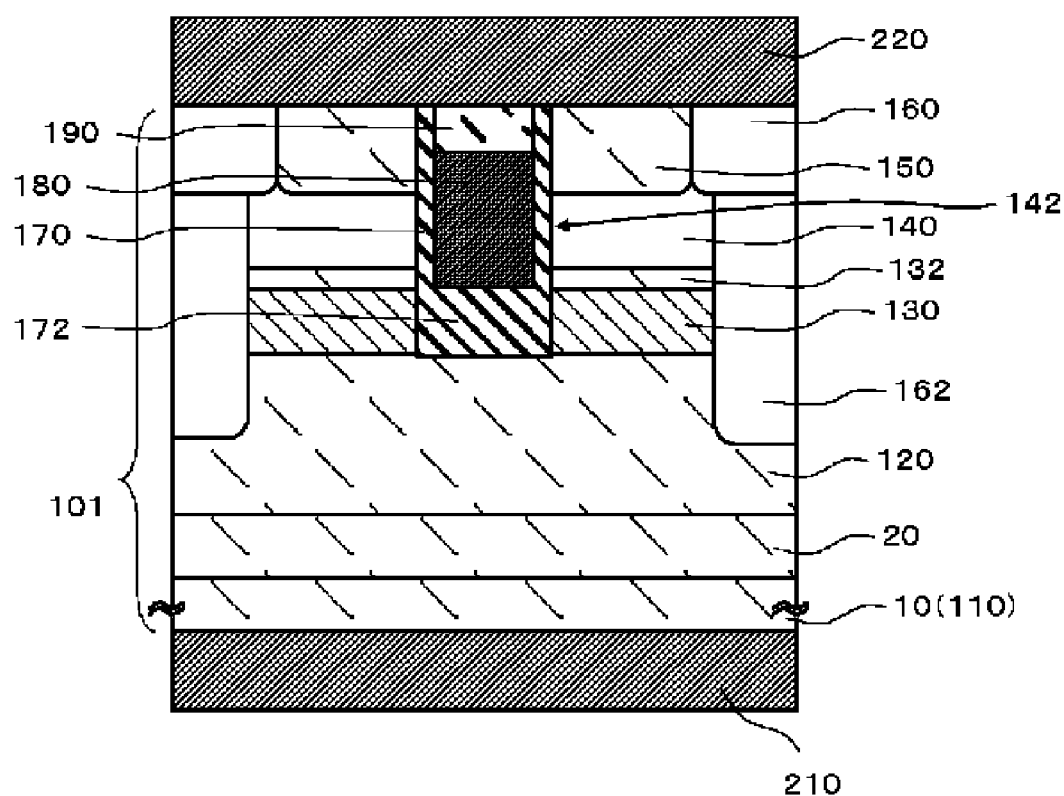
FIG. 31 is a cross-sectional view showing a configuration of a semiconductor device according to a fifth embodiment.

FIG. 31 is a cross-sectional view showing a configuration of the semiconductor device 100 according to a fifth embodiment, and it corresponds to FIG. 17 in the second embodiment. The semiconductor device 100 according to the present embodiment has the configuration similar to that in the semiconductor device 100 according to the second embodiment except for having a second conductivity type buried layer 162. That is, the semiconductor device 100 according to the present embodiment has a super junction structure.

The second conductivity type buried layer 162 is located inside the base layer 160 when viewed from a plane. An upper end of the second conductivity type buried layer 162 is in contact with the base layer 160, and a lower end thereof is located in the drift layer 120. An impurity concentration of the second conductivity type buried layer 162 is, for example, not less than $10^{17}$ cm$^{-3}$ and not more than $10^{19}$ cm$^{-3}$.

A method of forming the semiconductor device 100 according to the present embodiment has a configuration similar to that in the semiconductor device 100 according to the second embodiment except that a step of forming the second conductivity type buried layer 162 is added.

Figure 32:
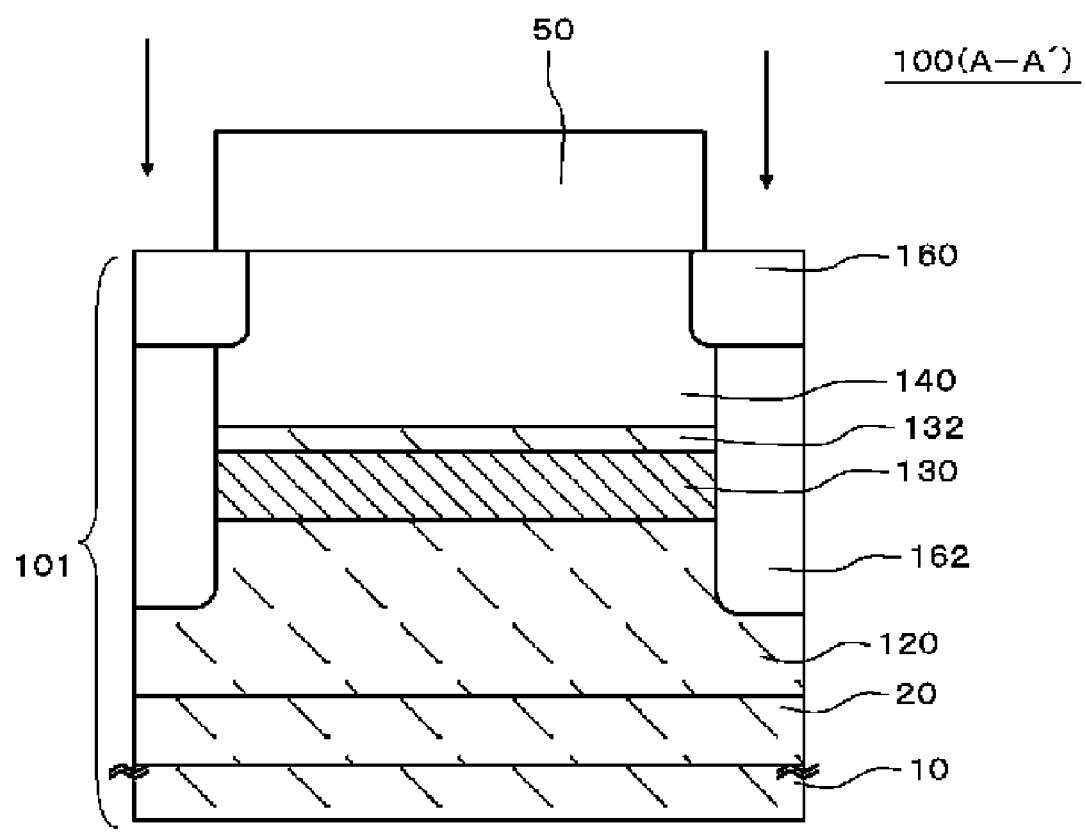
FIG. 32 is a view showing a first example of a method of forming a second conductivity type buried layer.

FIG. 32 shows a first example of a method of forming the second conductivity type buried layer 162. In the example shown in this figure, the second conductivity type buried layer 162 is formed before the source layer 150 is formed, after the base layer 160 is formed. Specifically, a resist pattern 50 is formed over the channel layer 140, and ion injection is performed to the semiconductor substrate 101 by using the resist pattern 50 as a mask. As a result, the second conductivity type buried layer 162 is formed.

Figure 33:
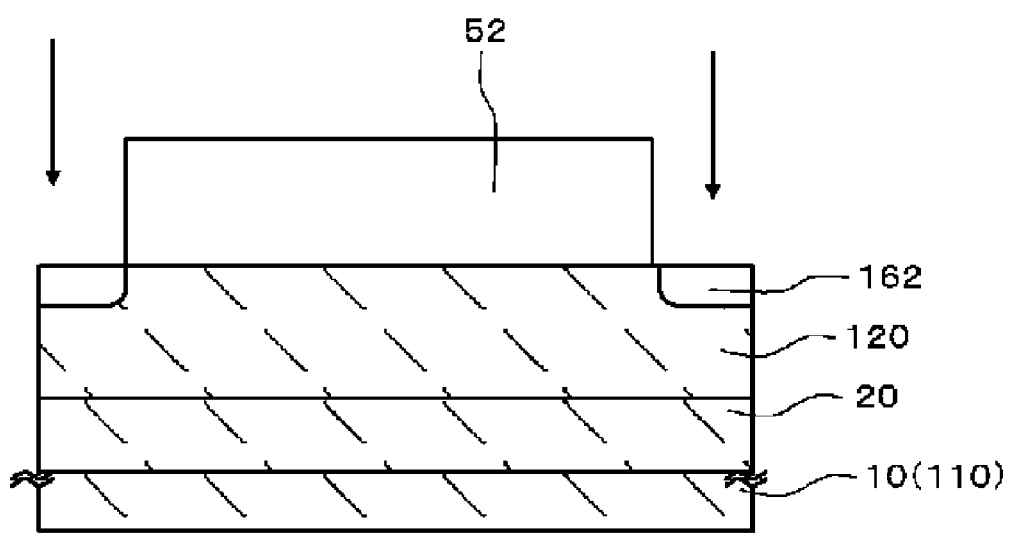
FIG. 33 is a view showing a second example of the method of forming the second conductivity type buried layer.
Figure 34:
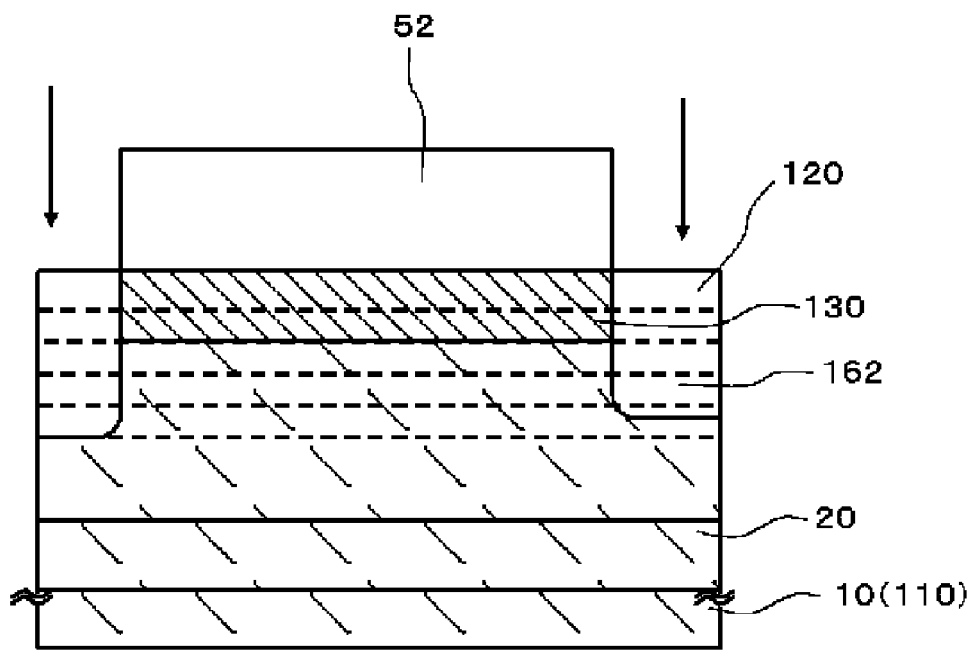
FIG. 34 is a view showing the second example of the method of forming the second conductivity type buried layer.

FIGS. 33 and 34 show a second example of the method of forming the second conductivity type buried layer 162. In the example shown in this figure, the second conductivity type buried layer 162 is formed in a step of forming the semiconductor substrate 101. Specifically, first, as shown in FIG. 33, a part of the drift layer 120 is formed over the buffer layer 20. Next, a resist pattern 52 is formed over the drift layer 120, and ion injection is performed to the drift layer 120 by using the resist pattern 52 as a mask. As a result, a part of the second conductivity type buried layer 162 is formed.

Subsequently, the resist pattern 52 is removed. Next, as shown in FIG. 34, a part of the drift layer 120 is further epitaxially grown. After that, the resist pattern 52 is formed over a newly grown layer, and ion injection is performed to the drift layer 120 by using the resist pattern 52 as the mask. As a result, a part of the second conductivity type buried layer 162 is formed. These steps are repeated not only in the step of forming the drift layer 120, but also in a step of forming the first conductivity type layer 130 (FIG. 34), a step of forming the interlayer 132, and a step of forming a lower portion of the channel layer 140. As a result, the second conductivity type buried layer 162 is formed.

Also according to the present embodiment, an effect similar to that in the second embodiment can be obtained. In addition, a p-n junction in a lateral direction is formed between the second conductivity type buried layer 162 and the drift layer 120. An electric field in the lateral direction is generated in the drift layer 120 due to this p-n junction. The electric field in the lateral direction alleviates the change of the electric field in a longitudinal direction in the drift layer 120. Accordingly, the concentration of the electric field on a particular point (for example, a lower end of the bottom surface insulating film 172) in the drift layer 120 can be suppressed. It should be noted that the second conductivity type buried layer 162 shown in the present embodiment maybe provided in the first, third, or fourth embodiment.

Sixth Embodiment

Figure 35:
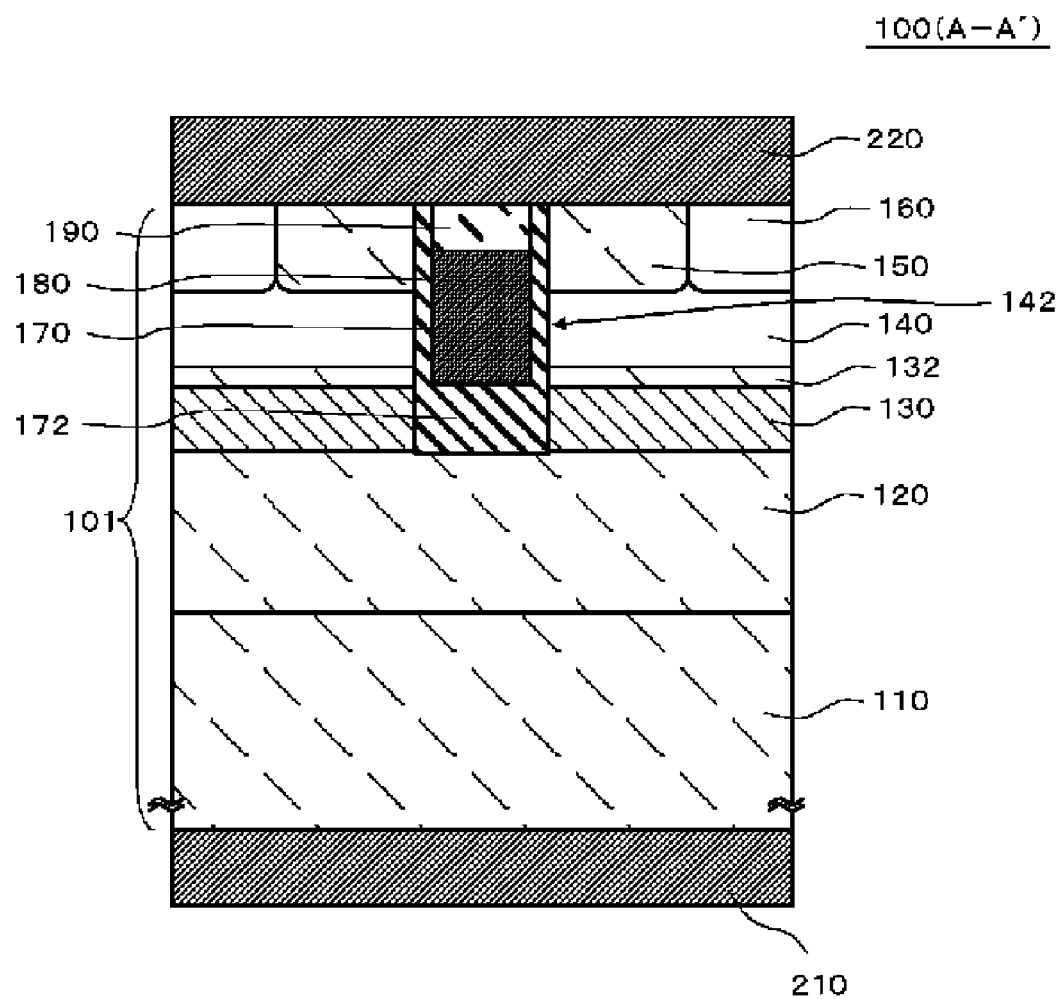
FIG. 35 is a cross-sectional view showing a configuration of a semiconductor device according to a sixth embodiment.

FIG. 35 is a cross-sectional view showing a configuration of the semiconductor device 100 according to a sixth embodiment, and it corresponds to FIG. 17 in the second embodiment. The semiconductor device 100 according to the present embodiment is similar to that in the second embodiment except for not having the buffer layer 20.

The semiconductor substrate 101 shown in this figure is, for example, an Si substrate. The drift layer 120, the first conductivity type layer 130, the interlayer 132, and the channel layer 140 maybe formed by epitaxial growth just like in the second embodiment, or may be formed by ion injection. In the former case, the substrate 10 (i.e., the drain layer 110) serves as an Si substrate in a bulk state. In the latter case, a region of the semiconductor substrate 101 where an impurity is not ion-injected serves as the drain layer 110. Also according to the present embodiment, an effect similar to that in the second embodiment can be obtained.

Seventh Embodiment

Figure 36:
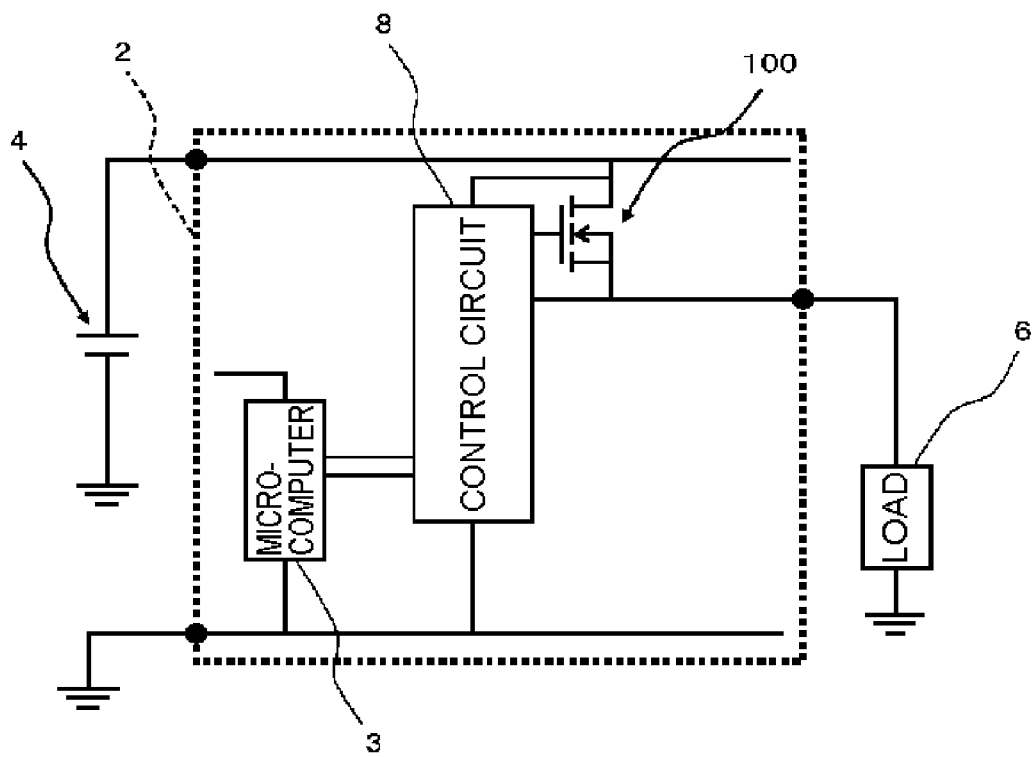
FIG. 36 is a diagram showing a circuit configuration of an electronic device according to a seventh embodiment.

FIG. 36 is a diagram showing a circuit configuration of an electronic device according to a seventh embodiment. This electronic device is, for example, used for a vehicle, and has an electronic device 2, a power supply 4, and a load 6. The power supply 4 is, for example, a battery mounted over the vehicle. The load 6 is, for example, an electronic part mounted over the vehicle, such as a head lamp, a power window, or a windshield wiper. Additionally, the electronic device 2 controls electric power supplied to the load 6 from the power supply 4.

The electronic device 2 is the device in which semiconductor devices 3, 8, and 100 are mounted over a circuit board (for example, a printed circuit board). The semiconductor device 3 is a microcomputer, and is coupled to the semiconductor device 8 via wiring of the circuit board. The semiconductor device 8 has a control circuit that controls the semiconductor device 100. For details, the semiconductor device 3 inputs a control signal to the semiconductor device 8. The semiconductor device 8 then inputs a signal to the gate electrode 180 of the semiconductor device 100 in accordance with the control signal input from the semiconductor device 3. That is, the semiconductor device 8 controls a vertical transistor of the semiconductor device 100. By the control of the vertical transistor, the electric power from the power supply 4 is appropriately supplied to the load 6.

Hereinbefore, the invention made by the inventor has been specifically explained on the basis of the embodiments, but the present invention is not limited to the above-described embodiments, and it is needless to say that various changes can be made without departing from the gist of the invention.

What is claimed is:

1. A semiconductor device comprising:
a first conductivity type drain layer;
a first conductivity type drift layer being formed above the drain layer, and having an impurity concentration lower than that in the drain layer;
a second conductivity type channel layer located over the drift layer;
a concave portion being formed in the channel layer, and having a lower end located below the channel layer;
a gate insulating film formed on a side wall of the concave portion;
a bottom surface insulating film formed on a bottom surface of the concave portion;
a gate electrode buried in the concave portion;
a first conductivity type source layer that is formed in the channel layer so as to be shallower than the channel layer, and that is located next to the concave portion when viewed from a plane; and
a first conductivity type layer being located between the channel layer and the drift layer, and having an impurity concentration higher than that in the drift layer,
wherein when viewed in a thickness direction, at least one of an upper end and a lower end of the first conductivity type layer, and a center thereof overlap with the bottom surface insulating film.

2. The semiconductor device according to claim 1, wherein when viewed in the thickness direction of the first conductivity type layer, both of the upper end and the lower end of the first conductivity type layer overlap with the insulating film.

3. The semiconductor device according to claim 1, wherein when viewed in the thickness direction of the first conductivity type layer, a thickness of a portion of the first conductivity type layer that does not overlap with the bottom surface insulating film is not more than 10% of a thickness of the first conductivity type layer.

4. The semiconductor device according to claim 1, wherein an impurity concentration of the first conductivity type layer is not less than $1\times10^{17}$ cm$^{-3}$ and not more than $1\times10^{19}$ cm$^{-3}$.

5. The semiconductor device according to claim 1, wherein when the thickness of the first conductivity type layer is set as t, and the impurity concentration of the first conductivity type layer is set as N, an inequality of $t \times N < 1.25 \times 10^{16}$ m$^{-2}$ holds.

6. The semiconductor device according to claim 1, wherein the first conductivity type layer and the channel layer are epitaxial layers, and
wherein impurities are introduced at the time of epitaxial growth.

7. The semiconductor device according to claim 1, wherein the drain layer, the drift layer, the first conductivity type layer, the channel layer, and the source layer are compound semiconductor layers.

8. The semiconductor device according to claim 1, comprising an interlayer provided between the first conductivity type layer and the channel layer.

9. The semiconductor device according to claim 8, wherein the interlayer is thinner than the first conductivity type layer.

10. The semiconductor device according to claim 8, wherein the interlayer is a first conductivity type layer having an impurity concentration lower than that in the first conductivity type layer.

11. The semiconductor device according to claim 8, wherein the gate insulating film has a thick film portion thicker than a portion of the gate insulating film overlapping with the channel layer, in a region overlapping with the interlayer in the thickness direction of the first conductivity type layer, and wherein the thick film portion is linked to the bottom surface insulating film.

12. The semiconductor device according to claim 1, wherein the bottom surface insulating film is thicker than the gate insulating film.

13. The semiconductor device according to claim 12, comprising a buried electrode that is buried in the bottom surface insulating film, and that is insulated from the gate electrode via the bottom surface insulating film.

14. A method of manufacturing a semiconductor device, comprising the steps of:

forming, over a first conductivity type drain layer, a first conductivity type drift layer having an impurity concentration lower than that in the drain layer;

forming, over the drift layer, a first conductivity type layer having an impurity concentration higher than that in the drift layer;

forming, over the first conductivity type layer, a second conductivity type channel layer;

forming, in the channel layer, a concave portion having a lower end located below the channel layer;

forming a gate insulating film on a side wall of the concave portion, and forming a bottom surface insulating film on a bottom surface of the concave portion;

burying a gate electrode in the concave portion; and after forming the channel layer, forming, on a surface layer of the channel layer, a first conductivity type source layer located next to the concave portion, wherein when viewed in a thickness direction, at least one of an upper end and a lower end of the first conductivity type layer, and a center thereof are made to overlap with the bottom surface insulating film.

* * * * *